United States Patent [19]

Hatakeyama et al.

[11] Patent Number: 5,989,779

[45] Date of Patent: *Nov. 23, 1999

[54] FABRICATION METHOD EMPLOYING AND ENERGY BEAM SOURCE

[75] Inventors: Masahiro Hatakeyama; Katsunori Ichiki, both of Fujisawa; Tadasuke Kobata; Yotaro Hatamura, 2-12-11 Kohinanta, Bunkyo-ku, both of Tokyo; Masayuki Nakao, Matsudo, all of Japan

[73] Assignees: Ebara Corporation; Yotaro Hatamura, both of Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/544,108

[22] Filed: Oct. 17, 1995

[30] Foreign Application Priority Data

Oct. 18, 1994 [JP] Japan .................................. 6-252311
Feb. 17, 1995 [JP] Japan .................................. 7-053231

[51] Int. Cl.$^6$ .............................. G03C 5/00; G21K 5/10; B23K 15/00
[52] U.S. Cl. ...................... 430/296; 430/311; 250/492.3; 250/492.23; 219/121.14
[58] Field of Search ................................ 430/296, 297, 430/311; 250/492.3, 492.23; 219/121.14

[56] References Cited

U.S. PATENT DOCUMENTS

| 4,324,854 | 4/1982 | Beauchamp et al. | 430/296 |
| 4,505,949 | 3/1985 | Jelks | 427/38 |
| 4,510,386 | 4/1985 | Franks | 250/251 |

(List continued on next page.)

FOREIGN PATENT DOCUMENTS

| 0 497 227 | 8/1992 | European Pat. Off. |
| 0 531 949 | 3/1993 | European Pat. Off. |
| 0 639 939 | 2/1995 | European Pat. Off. |

OTHER PUBLICATIONS

Tetsuro Nakamura et al., "Fabrication Technology of Integrated Circuit", published by Sangyo Tosho Publishing Company (Japan), 1987, pp. 21–23.

Fusao Shimokawa et al., J. Appl. Phys. 66(6), Sep. 15, 1989, pp. 2613–2618.

Nuclear Instruments & Methods in Physics Research, Section—B: Beam Interactions With Materials and Atoms, vol. B33, No. 1–04, Jun. 2, 1988, pp. 867–870, XP 000022017, Shimokawa, F. et al., 'A Low–Energy Fast–Atom Source'; p. 867, Figure 1.

*Primary Examiner*—Janet Baxter
*Assistant Examiner*—Rosemary Ashton
*Attorney, Agent, or Firm*—Wenderoth, Lind & Ponack, L.L.P.

[57] ABSTRACT

An energy beam source is used in micro-fabrication tasks, such as fabrication of specific patterns, in-situ bonding, repair, connection and disconnection of electrical paths, applicable to semiconductor devices and other micro-sized circuits in integrated circuits. The beam source is made compact so that several sources can be located inside a vacuum vessel and in conjunction with micro-manipulators or micro-movement stages operated under light or an electron microscope. The beam source is provided with at least three electrodes, and by applying a selected voltage, i.e., high frequency voltage, direct current voltage and ground voltage, on each the three electrodes in association with film-forming substance(s), virtually any type of deposit can be formed at any location of a workpiece. Different types of particle beams, such as positive and negative ion beams, a highspeed neutral atomic beam, a radical particle beam, an electron beam can be produced from the beam source by judicious choice of operating-parameters and the film-forming material which may be a process gas or an applied coating. By using the beam source and the method of deposit forming presented, virtually any type of fabrication task can be carried out on any surface and any location of a workpiece in a three-dimensional space.

15 Claims, 28 Drawing Sheets

U.S. PATENT DOCUMENTS

| | | | |
|---|---|---|---|
| 4,757,179 | 7/1988 | Matrisian et al. | 219/121.64 |
| 4,775,789 | 10/1988 | Albridge et al. | 250/251 |
| 4,793,908 | 12/1988 | Scott et al. | 204/192.11 |
| 4,870,284 | 9/1989 | Hashimoto et al. | 250/423 R |
| 4,874,459 | 10/1989 | Coldren et al. | 156/643 |
| 5,113,072 | 5/1992 | Yamaguchi et al. | 250/309 |
| 5,135,695 | 8/1992 | Marcus | 264/141 |
| 5,149,973 | 9/1992 | Morimoto | 250/492.2 |
| 5,223,692 | 6/1993 | Lozier et al. | 219/121.67 |
| 5,468,595 | 11/1995 | Livesay | 430/296 |

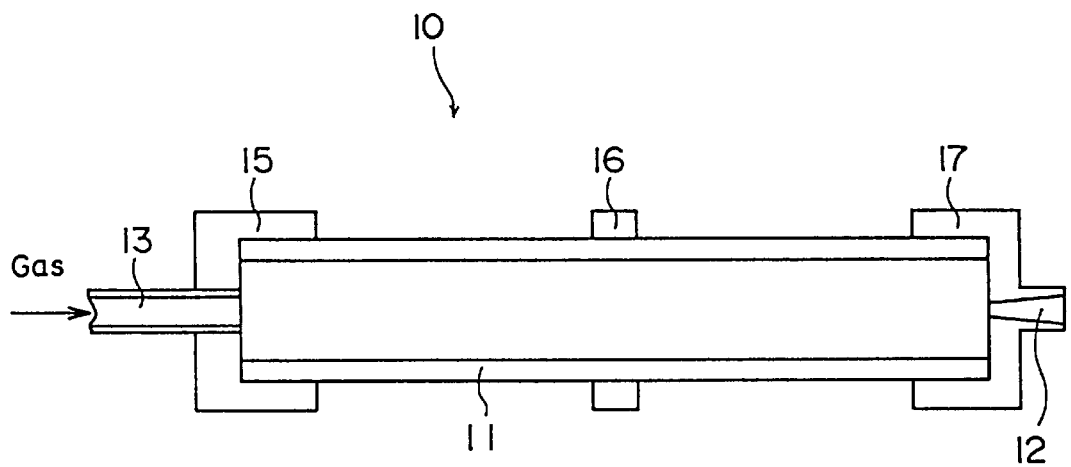
F I G. 1
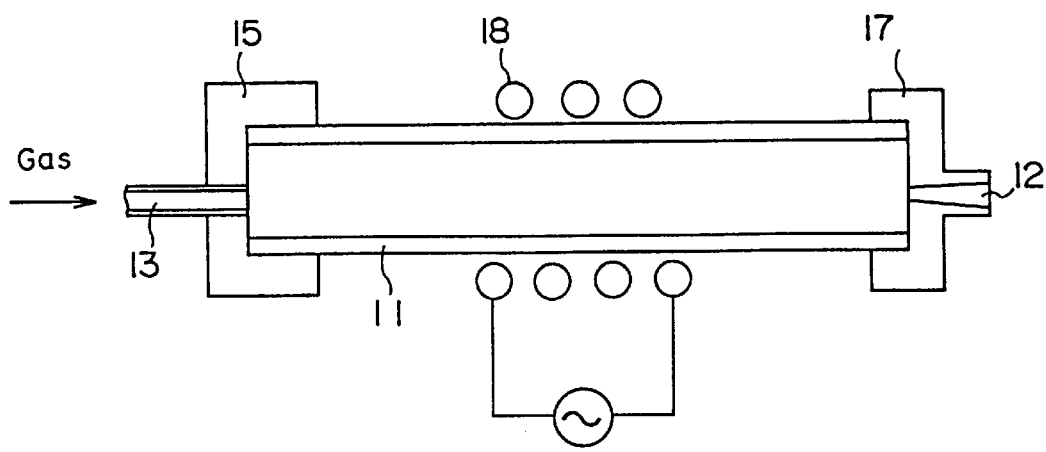
F I G. 2

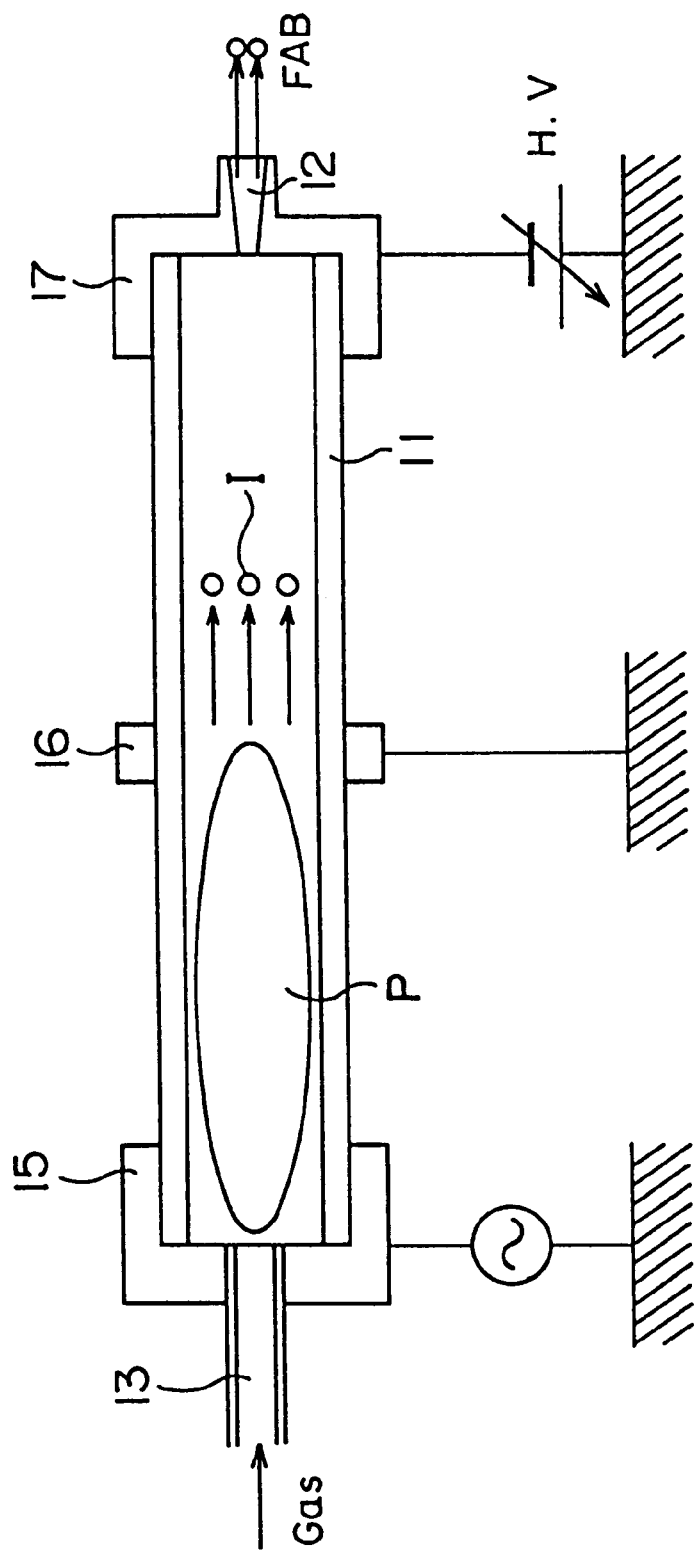
F I G. 5

FIG. 13
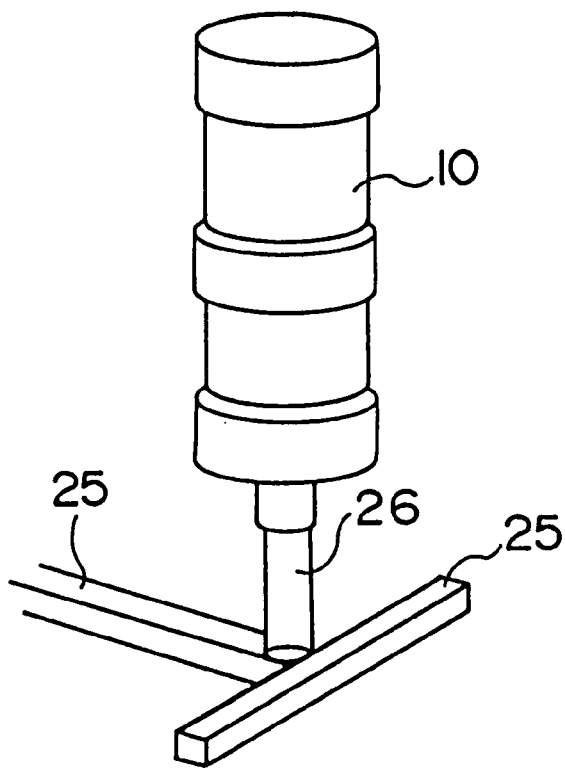
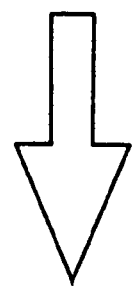
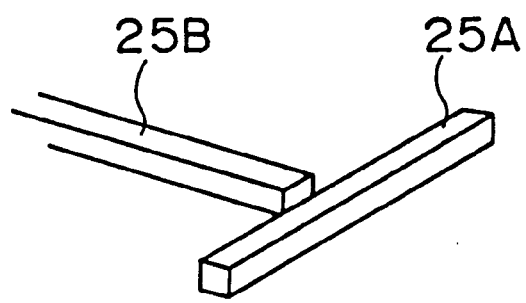

FIG. 15
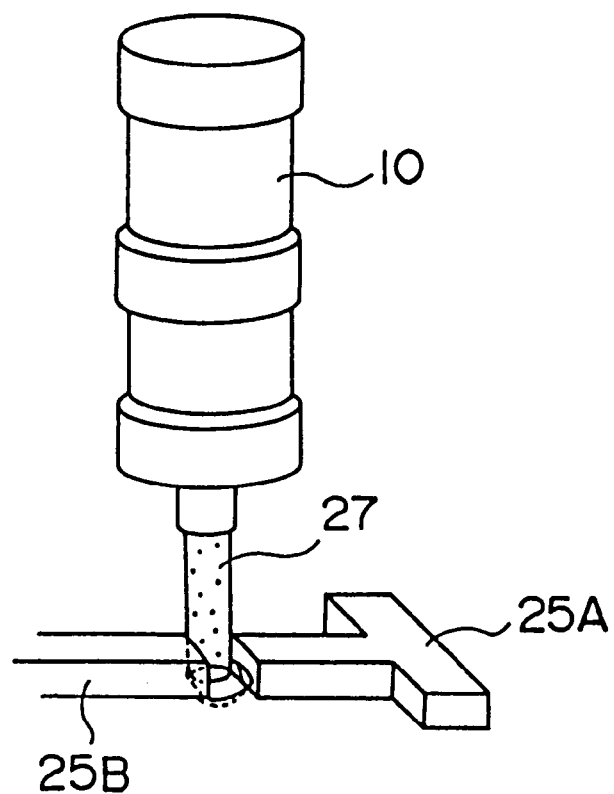
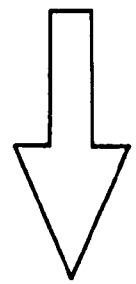
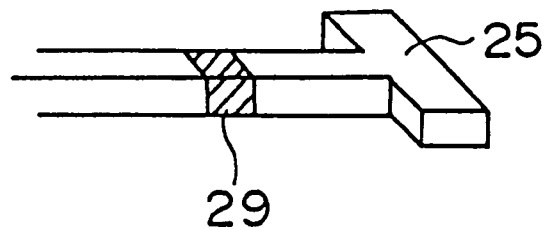

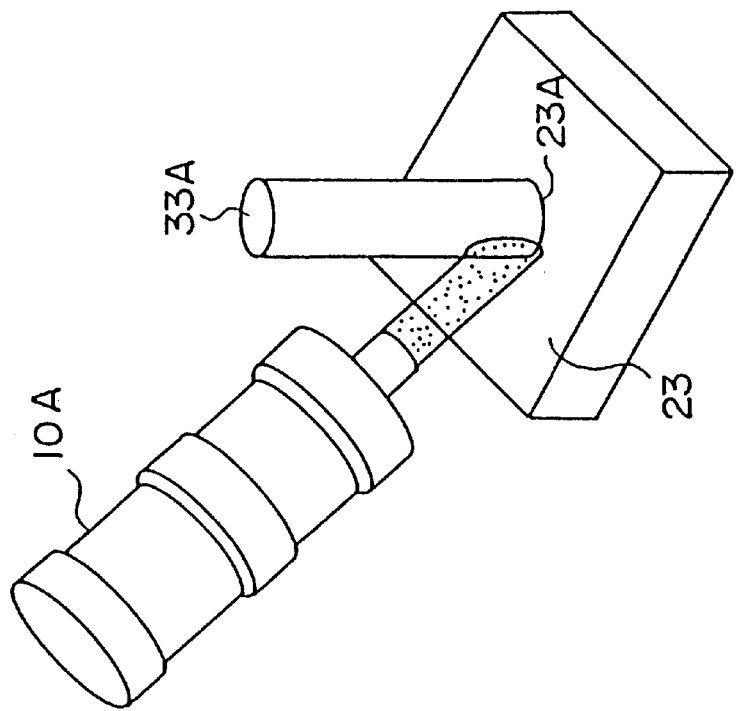
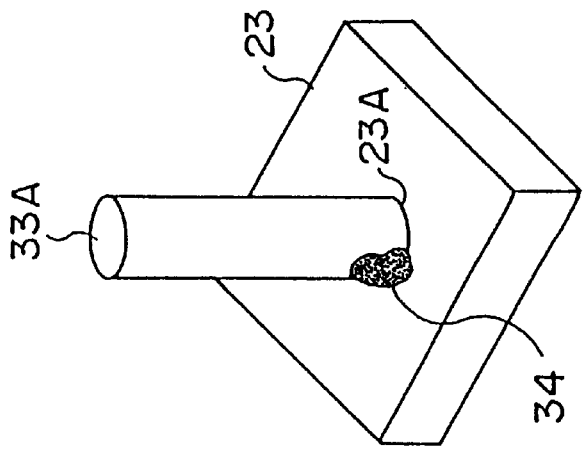
FIG. 19

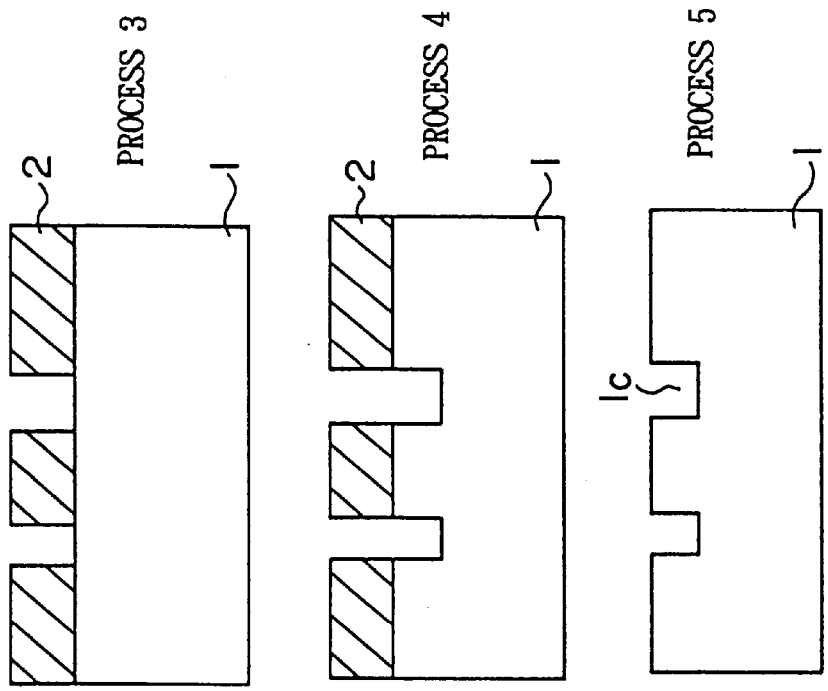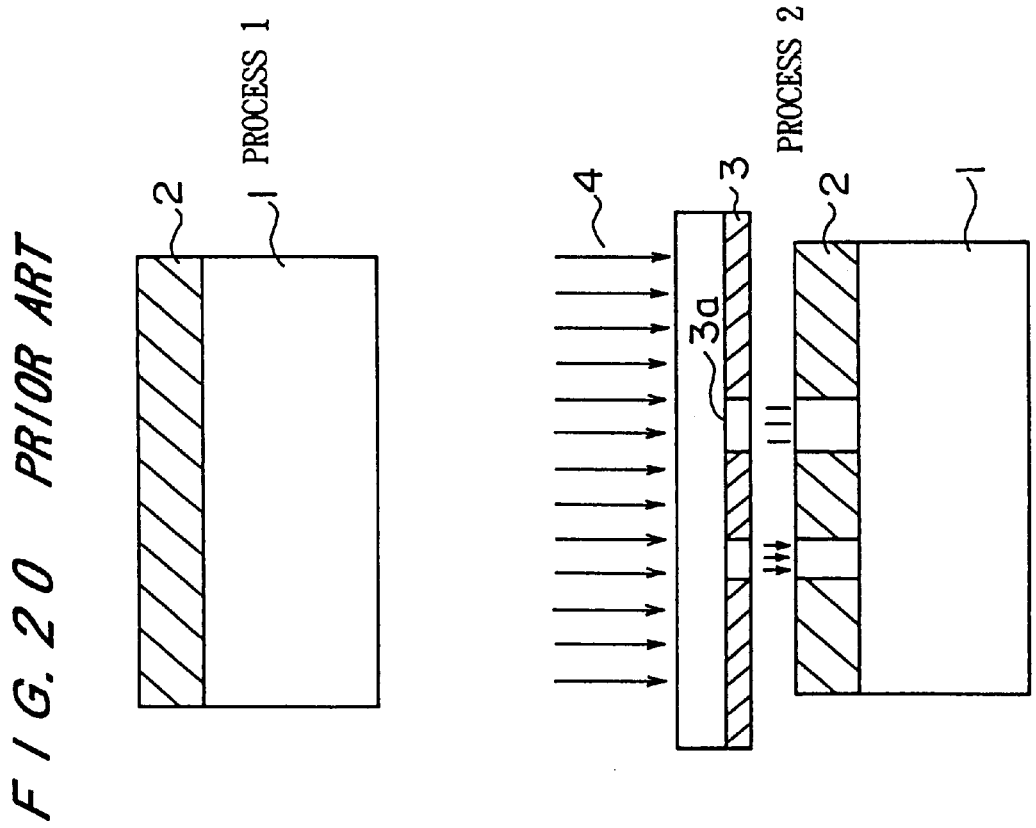
FIG. 20 PRIOR ART

५,९८९,७७९

FABRICATION METHOD EMPLOYING AND ENERGY BEAM SOURCE

BACKGROUND OF THE INVENTION

1. Field of the Invention

The present invention relates in general to particle beam generation sources, and relates in particular to a particle beam generation source which is capable of generating a plurality of beams of different energy levels by impressing different types of electrical voltage on electrodes of a beam discharge tube to perform different fabrications. The present invention relates also to a micro-fabrication apparatus for conducting simultaneous or serial fabrication processes on one workpiece by using the energy beam source of a compact design. The present invention also relates to a method of making suitable patterns on any surface of fine parts such as micromachines and semiconductor elements. The energy beam source of the present invention is employable to micro-fabricate a pattern of the order of manometer spacing (nm), for example, disconnecting/connecting wiring patterns or fabricating a three-dimensional architecture on an insulating substrate base.

2. Description of the Related Art

Conventional particle beam sources such as ion beam sources and other beam sources for forming charged ions or radical particles in plasma processing are provided with a fixed applied voltage because such beam sources are generally designed to be used for one end objective, and require only one type of particle beam to be generated therefrom. For example, in ion beam sources, the ion acceleration electrode is supplied with a direct current voltage, and the ion energy beam is varied by varying the magnitude of the applied direct current voltage. The ion beam source of such a design is generally not capable of generating other types of particles.

Energy beams are used in photolithographic processes to carry out micro-fabrication of fine semiconductor patterns. A basic photolithographic process of fabricating semiconductors is explained in the following.

FIG. 20 shows a conventional micro-fabrication process using photolithography. In Step 1, a semiconductor substrate base 1 is coated with a photoresist material 2. In Step 2, ultraviolet (UV) light 4 is irradiated through a photomask 3 to transfer pattern holes 3a of the photomask 3 to the photoresist coating 2. In Step 3, through a development process, those areas of the photoresist material 2 which were exposed to the UV light 4 through the patterns holes 3a are removed. By utilizing ions and radical particles in a plasma discharge, anisotropic etching is performed in Step 4 on those areas which are not protected by the photoresist coating 2. The final step, Step 5, is the removal of the photoresist coating. At least the above series of basic steps are required to produce cavities 1c of the same pattern as the pattern holes 3a of the photomask 3 on the surface of the substrate base 1. The usual practice for fabricating a semiconductor device is to repeat the above series of basic steps combined with introduction of dopants at selected stages of the photolithographic process.

Also, conventional methods of forming a film deposit on a surface of electronic parts, fine machinery parts and medical devices involve some vacuum deposition or sputtering process.

As shown in FIG. 31, a vacuum deposition process comprises the steps of: heating a target material 6 in a vacuum vessel 5 with a heater 6a; vaporizing the target material 6 to deposit a vapor on a workpiece 7, such as a substrate base, to be coated; depositing a film 6c by continuing the vaporizing and coating processes. The method of heating includes resistance heating, radiation heating and electron beam heating.

A sputtered coating is formed by enclosing a substrate base 7 in a vacuum vessel, as shown in FIG. 32, and a high energy beam such as an ion beam is radiated from a beam source 8 to a target source 9, and sputtered particles 9a, which is a secondary emission product from the target source 9, are deposited on the substrate base 7 to form a sputtered coating 9b.

There are several inherent problems in the conventional technology that limit the production capability of deposit making devices. These problem will be discussed in some detail in the following.

According to the conventional photolithographic method presented above, it is difficult to produce patterns of ultrafine line widths or diameters, and at the present time, special approaches are needed to produce finer patterns than those generally available.

Also, the ion beam source is usually fixed on a flange and the degree of freedom of orientating the source is severely limited. Consequently, it is difficult to position the beam source so that any surface of a workpiece may be irradiated, and it is especially difficult to employ a plurality of energy beam sources to perform a three-dimensional irradiation on the workpiece.

Also, in micro-fabrication processes on semiconductor materials using the conventional photolithography technique, it is necessary for the substrate base to have certain surface qualities, such as high flatness, and those bases having poor surface finish, or bowing are rejected. Furthermore, it is, difficult to produce a photoresist pattern on more than one surface of one workpiece at any one time. This is because transfer of each pattern requires preparation of a photomask, thus necessitating the preparation of a photomask for each pattern. It will be understood that the entire process is quite cumbersome and expensive, and limits the degree of freedom of pattern making on the substrate base. Therefore, there is a need for developing a new technology for pattern transfer and etching processes.

Another problem of conventional methods is that if an ion beam source or electron beam source is used to remove a photoresist coating, in addition to having such beam sources, it is necessary to have a reactive gas supply facility. Further, the ion beam source or electron beam source is fixed to a flange, and as mentioned earlier, although a certain degree of movement of the workpiece is feasible, such movement basically is restricted to a two-dimensional fabrication task on one surf ace of the workpiece. It is even more difficult to perform fabrication on one selected spot of the workpiece using freely selectable beam sources and different incident beam angles.

As summarized above, the conventional film deposit forming processes are designed to produce a pattern uniformly overall on a selected surface of a workpiece, and they are not suitable for producing desired patterns on selected surfaces or locations on the workpiece. The result is that it is difficult presently to produce a high performance assembled part from several microsized parts or to produce a film deposit on complexly shaped articles.

In other words, assembling of micro-parts or forming a film deposit on a complexly shaped part requires that a deposit of a certain pattern is formed on a selected surface or on a restricted location of a workpiece. However, the conventional methods are designed for forming a film deposit of uniform characteristics and are inadequate to meet the growing demand for a more flexible and adaptable system for performing micro-fabrication in a three-dimensional space.

SUMMARY OF THE INVENTION

It is an object of the present invention to provide an energy beam source having an ability to produce a plurality of energy levels or a plurality of particle types from a singular energy beam source or from a plurality of energy beam sources so as to enable a variety of fabrication tasks to be performed simultaneously or serially. Another object is to provide a method for making film deposits using the energy beam source so that film deposits having desired patterns on any specified surfaces or locations of a micro-sized workpiece may be fabricated, particularly on plural surfaces of a three-dimensional workpiece.

These objects are achieved by provision of an energy beam source comprising a discharge tube, a gas supply nozzle for supplying a process gas to the tube from upstream to downstream, a beam discharge nozzle having not less than one beam discharge opening, and not less than three electrodes disposed on the discharge tube. Each electrode of the not less than three electrodes can be supplied with an operating electrical voltage selected from a group consisting of a high frequency voltage, a direct current voltage and a ground voltage. The energy beam source supplies a beam having an adjustable energy level and a selectable species of particles chosen from a group consisting of positive ions, negative ions, highspeed neutral atoms, radical particles and electrons by suitably selecting operating parameters, including the operating electrical voltage associated with each of the not less than three electrodes and the process gas.

The beam source is able to generate a beam having any one of positive ions, negative ions, highspeed neutral atoms, radical particles and electrons by selecting operating parameters, such as high frequency voltage, DC voltage and ground voltage, to be applied to a combination of electrodes. Therefore, a variety of micro-fabrication tasks can be performed using one beam source.

An aspect of the beam source is that the beam discharge nozzle is provided with not less than one beam discharge opening, wherein a diameter range of the beam discharge opening is selected from a group consisting of a 0.1 nm to 10 nm range, a 10 nm to 100 nm range and a 100 nm to 10 pm range, and wherein a length of the beam discharge opening is selected from a group consisting of a 1 to 5 times the diameter, 5 to 10 times the diameter, and not less than 10 times the diameter.

Accordingly, an energy beam of an extremely fine size, embodied by 0.1 nm–10 pm, having an aspect ratio of the diameter to the length of the order of 1–10 can be generated. The efficiency of forming neutrally-charged atoms is improved, and a highly efficient highspeed atomic beam can be generated.

Another aspect of the beam source is that the energy beam source is a compact source, and not less than one of the beam sources is mounted on handling means, including a micro-manipulator and a rotation/translation stage, so as to provide freedom in orienting the beam source in any orientation with respect to a workpiece.

Accordingly, because the energy beam source is made compact and is mounted on a micro-movement stage, it is possible to irradiate a specific local area of the workpiece to perform micro-fabrication tasks such as local deposit forming and etching.

Another aspect of the beam source is that an electrode disposed in a farthest downstream location is provided with a patterned mask integrally formed with the electrode so as to permit a beam to pass through a patterned opening formed in the patterned mask.

Accordingly, because the beam source is provided with a patterned mask, the necessity for the photo-mask used in conventional photolithography can be eliminated.

Another aspect of the beam source is that the apparatus is provided with transport means for providing relative movement between the workpiece and the energy beam source for performing micro-fabrication tasks, including local film deposition, local etching, bonding and attaching.

Accordingly, because the source and the workpiece can be moved relative to one another by micro-movement devices, two beam sources, for example, can be used to perform different micro-fabrication tasks on any surface or location of the workpiece by suitably orienting the sources. Further, by focusing two kinds of beams on a local area of the workpiece, it is possible to achieve synergistic effects of different beams to achieve fabrication products which have not been possible heretofore.

An additional object of the present invention is to provide a method of micro-fabrication using the various types of beam sources presented above. For example, a low-energy beam is used in association with a film-forming gas. The low-energy beam may be radiated on a workpiece and a relative movement of the energy beam source and the workpiece is provided so as to produce any deposition pattern on any surface or any location on the workpiece.

Accordingly, it is not necessary to irradiate the entire surface of the workpiece with the film-forming particles, only selected local areas may be processed with the highly directed beam source, and the use of transport means makes it possible to perform processing on any surface and any location of the workpiece.

Another aspect of the method is that an electron beam is radiated on a workpiece through a patterned mask having a specific pattern. A relative movement of the energy beam source and the workpiece is provided so as to produce any deposition pattern on any surface or any location on the workpiece.

Accordingly, it is not necessary to irradiate the entire surface of the workpiece with the film-forming particles, only the selected local areas may be processed through the patterned mask, and the use of transport means makes it possible to perform processing on any surface and any location of the workpiece.

Another aspect of the method is that a coating of a film-forming material or supplying a film-forming gas may be applied to a surface of a workpiece. The electron beam is radiated on the surface of the workpiece so as to activate film-forming particles to form a film deposit on the surface. A relative movement of the energy beam source and the workpiece is provided so as to produce any deposition pattern on any surface or any location on the workpiece.

Accordingly, a highly directed electron beam can be radiated to activate the film-forming particles to form a local deposit, and the use of transport means makes it possible to perform processing on any surface and any location of the workpiece.

Another aspect of the method is that a coating of a film-forming material is applied or a film-forming gas is supplied on a surface of a workpiece, and an electron beam is radiated on the surface of the workpiece through a patterned mask having a specific pattern to form a film deposit on the surface. A relative movement of the electron beam source and the workpiece is provided so as to produce any deposition pattern on any surface or any location on the workpiece.

Accordingly, the pre-coated film-forming material or the particles of the film-forming gas can be activated locally by the electron beam passing through the patterned mask, and the use of transport means makes it possible to perform processing on any surface and any location of the workpiece.

A further aspect of the method is that a coating of a film-forming material is applied or a film-forming gas is supplied on a surface of a workpiece, and an electron beam is radiated on the surface of the workpiece from a shaped electrode configured to a specific pattern to form a film deposit on the surface. A relative movement of the electron beam source and the workpiece is provided so as to produce any deposition pattern on any surface or any location on the workpiece.

Accordingly, the pre-coated film-forming material or the particles of the film-forming gas can be activated by the highly directed electron beam from the shaped electrode, and the use of transport means makes it possible to perform processing on any surface and any location of the workpiece.

BRIEF DESCRIPTION OF THE DRAWINGS

FIG. 1 is a schematic illustration of a first embodiment of the energy beam source of the present invention.

FIG. 2 is a schematic illustration of a second embodiment of the energy beam source of the present invention.

FIG. 5 is a schematic illustration of a fifth embodiment of the energy beam source of the present invention.

FIG. 13 is a perspective view illustrating a process of the present invention.

FIG. 15 is a perspective view illustrating a process of the present invention.

FIG. 19 is an illustration of a bonding step of FIG. 18.

FIG. 20 is an illustration of a conventional process of photolithography.

DESCRIPTION OF THE PREFERRED EMBODIMENTS

Figure 3:
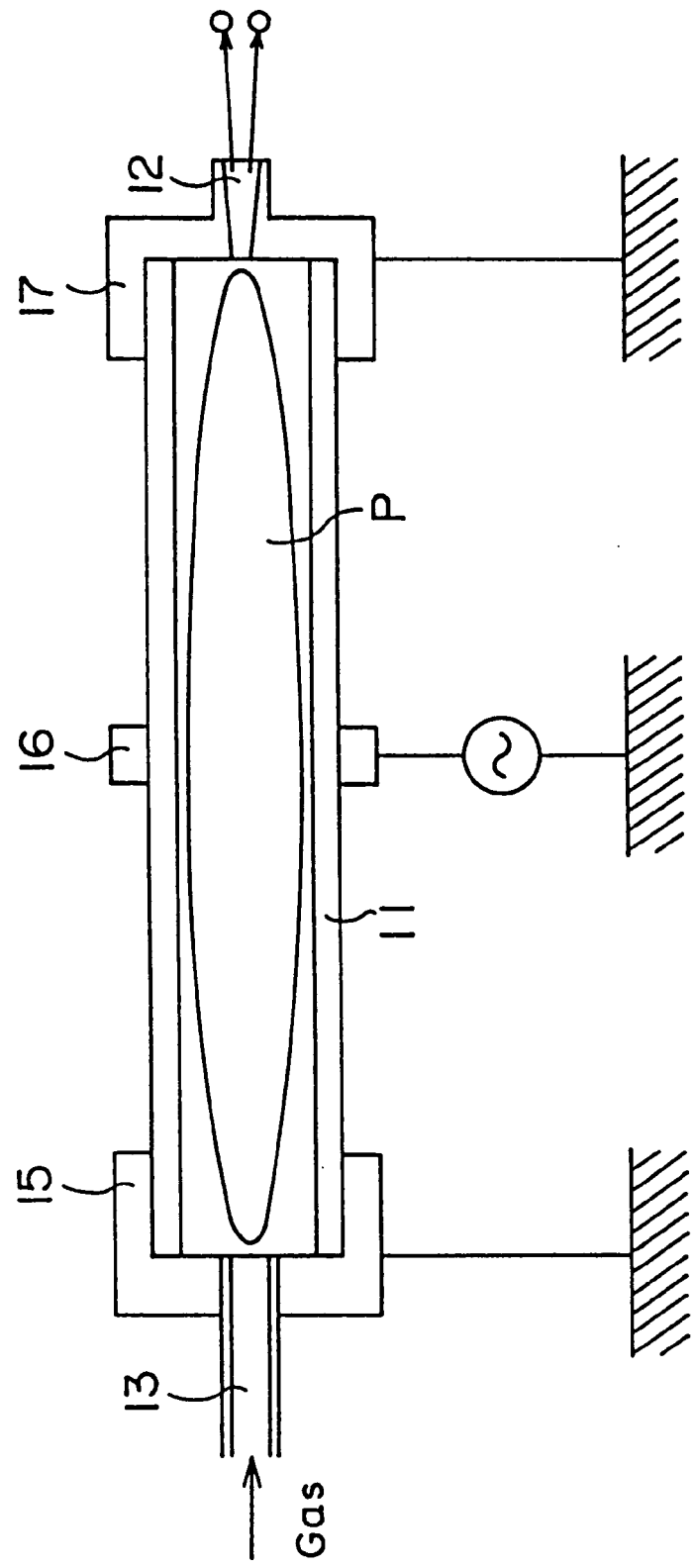
FIG. 3 is a schematic illustration of a third embodiment of the energy beam source of the present invention.

Preferred embodiments will be explained with reference to the drawings. The same reference numerals refer to the same or equivalent parts.

FIG. 1 illustrates an energy beam source of the first embodiment. The energy beam source (shortened to source hereinbelow) 10 is placed in a vacuum vessel (not shown) together with a workpiece to be irradiated with the beam. The source comprises three electrodes 15, 16 and 17, the middle electrode 16 is ring-shaped, attached to a discharge tube 11 made of a pyrex glass or quartz. The source is designed so that a process gas stream is made to flow from an inlet (upstream) to an outlet (downstream). The downstream electrode 17 is provided with a beam discharge nozzle having a beam discharge opening 12. The upstream electrode 15 is provided with a gas supply nozzle 13 for supplying a process gas to the interior of the discharge tube 11. The beam discharge opening may be singular or plural.

The source is a compact source, and it is possible to generate a beam of different energy levels or particle types by adjusting the type and magnitude of the voltage to be applied on the electrodes 15, 16 and 17. A desired fabrication process, such as etching, film deposition, bonding, attachment, can be performed on specified location of the workpiece. By using a plurality of sources, it is possible to perform a number of fabrications on the same surface of one workpiece in simultaneous or serial steps.

To perform etching using the source, a highly reactive process gas such as chlorine, $CCl_4$, $SF_6$, $CF_4'$ $O_2$ and chloro-fluoro hydrocarbons is used. For film deposition, process gases such as aluminum chloride, tungsten hexafluoride, methane, titanium chloride diluted with He and/or Ar gases are used.

Bonding and attachment can be performed by aligning the workpiece with the source, before fabrication, using a light microscope, laser microscope and scanning electron microscope (SEM) and the like magnifying means.

FIG. 2 shows a second embodiment of the source. The basic configuration is the same as that in the first embodiment, but a coil 18, equivalent to the middle electrode 16, is disposed in the center of the discharge tube 11 for applying a high voltage to generate a plasma within the tube 11. The high frequency inductive discharge by the coil 18 generates a higher density plasma than the capacitively coupled type due to the formation of a magnetic field by the application of the high frequency voltage to the coil and the consequent activation of electron activity by the magnetic field and their effect on plasma generation (in the process gas supplied from the gas nozzle). The process gas is referred to as gas hereinbelow.

FIG. 3 shows a third embodiment of the energy beam source. This is an example of using the source to generate radical particles. In this embodiment, the middle electrode can be either a ring type 16 or a coil type 18, but in either case, the electrode is supplied with a high frequency voltage. The remaining electrodes 15, 17 are grounded. A gas for forming the radical particles is introduced from a gas nozzle 13 disposed upstream, and a high frequency discharge plasma is formed within the tube 11. The radical particles formed in the plasma are accelerated by the pressure difference between the beam discharge opening 12 and the surrounding atmosphere, and are discharged through the beam to irradiate the workpiece disposed downstream. By grounding the upstream and downstream electrodes 15, 17, impressing a high frequency voltage on the middle electrode 16 or 18, and regulating the high frequency voltage, it is possible to emit the radical particles.

Figure 4:
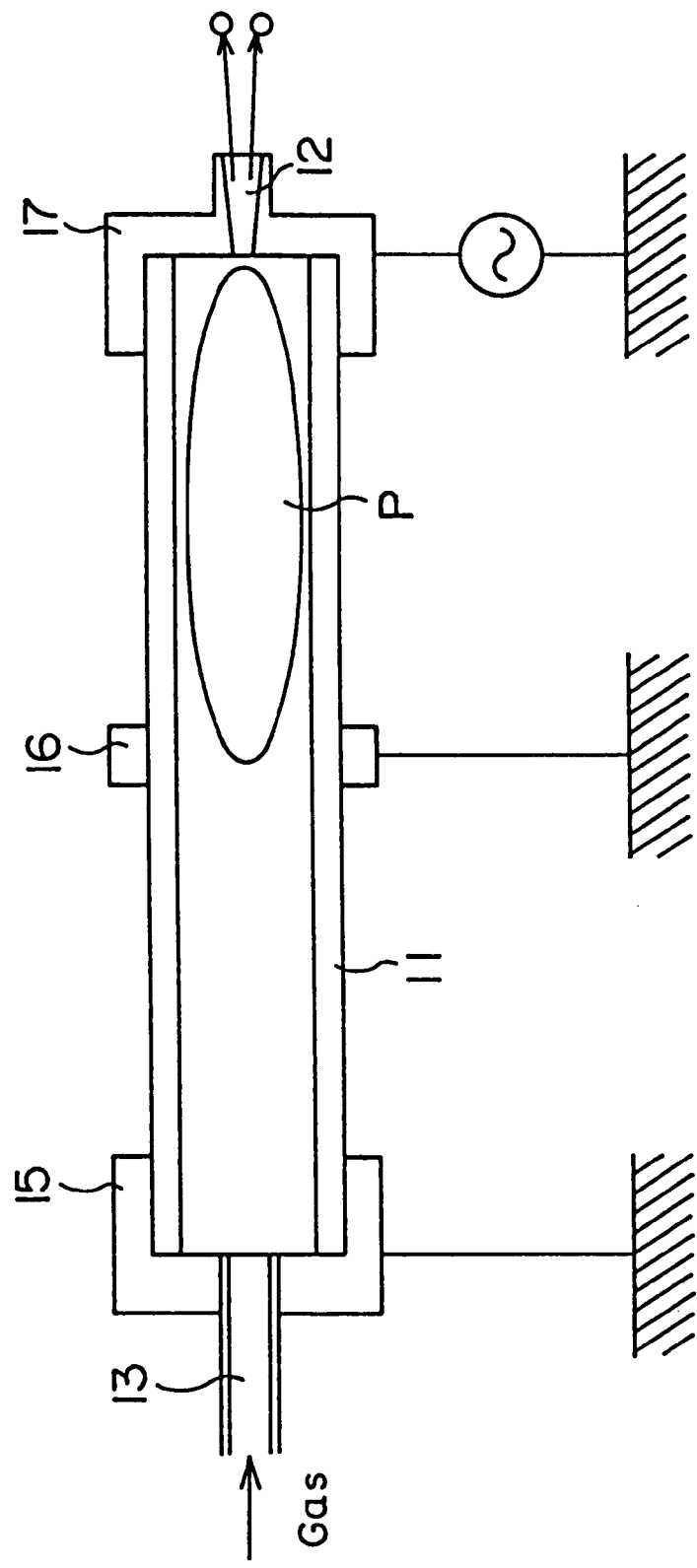
FIG. 4 is a schematic illustration of a fourth embodiment of the energy beam source of the present invention.

FIG. 4 shows a fourth embodiment of the energy beam source. In this embodiment, the downstream electrode 17 is applied with a high frequency voltage. In this case, the middle electrode 16 is a ring electrode, and electrodes 16 and 17 are grounded along with the upstream electrode 15. In this case, discharge occurs between the middle electrode 16 and the downstream electrode 17, and a plasma is generated in the downstream side of the discharge tube 11. Plasma radical particles are emitted from the beam discharge opening 12 due to the pressure differential between the interior and exterior of the tube 11 as in the previous embodiment. However, because the high frequency voltage is applied to downstream electrode 17, electron vibrational activities are generated near the beam discharge opening 12 also, and the radical particles become activated in this vicinity, thereby making it possible to irradiate the workpiece with radical particles of a high activity.

FIG. 5 shows a fifth embodiment of the energy beam source. This is an example of varying the voltage to be applied to the electrodes to generate a high speed atomic beam. In FIG. 5, a high frequency voltage is applied to the upstream electrode 15 having gas supply nozzle 13, the middle electrode 16 is grounded and the downstream electrode 17 is supplied with a negative voltage. Therefore, discharge is generated by the two electrodes on the upstream side of the tube 11, and a plasma is generated. The positive ions in the plasma are accelerated towards the downstream electrode 17, and perform charge exchange with the residual gaseous particles in the beam discharge opening 12, and are emitted as a neutral high speed atomic beam.

Figure 6:
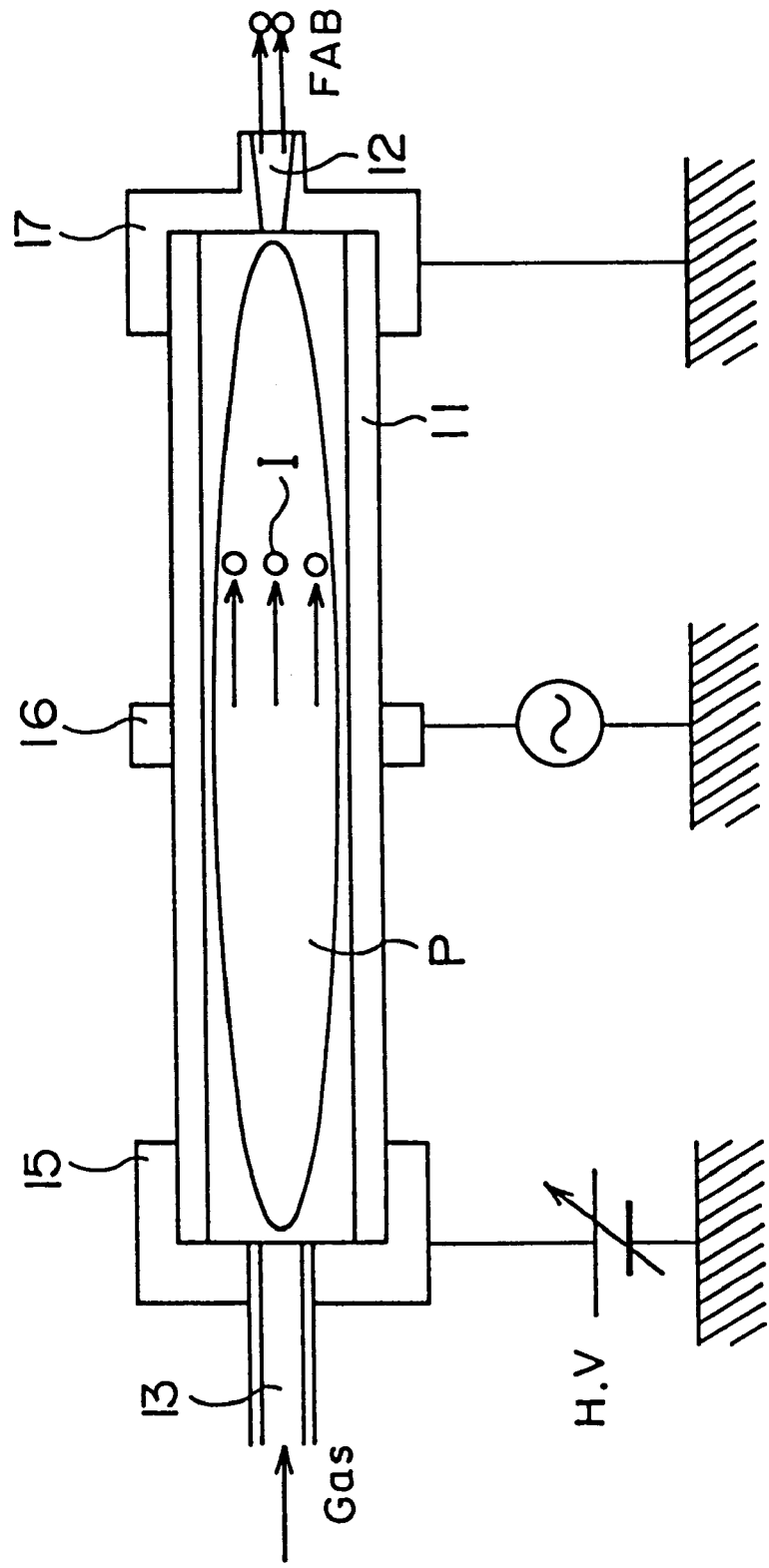
FIG. 6 is a schematic illustration of a sixth embodiment of the energy beam source of the present invention.

FIG. 6 shows a sixth embodiment of the energy beam source. In this embodiment, a positive DC voltage is applied on the upstream electrode 15, and the high frequency voltage is applied on the middle electrode 16. The downstream electrode 17 is grounded. In this case, the middle electrode can be either a capacitively coupled type or an inductively coupled type. If it is capacitive, a ring electrode 16 is used, and if it is inductive, a coil electrode 18 is used. The acceleration biasing voltage between the electrodes 15, 17 is kept constant, and electron activity is promoted by the high frequency voltage applied to the middle electrode 16 or 18, and a plasma is generated. The positive ions in the plasma are accelerated by the biasing voltage towards the downstream electrode 17 provided with a beam discharge opening 12, and are neutralized in the beam discharge opening 12. Also, by impressing a positive voltage on the downstream electrode 17 and grounding the upstream electrode 15, it is possible to irradiate the workpiece with high speed atomic beam of negative ions generated in the plasma.

Figure 7:
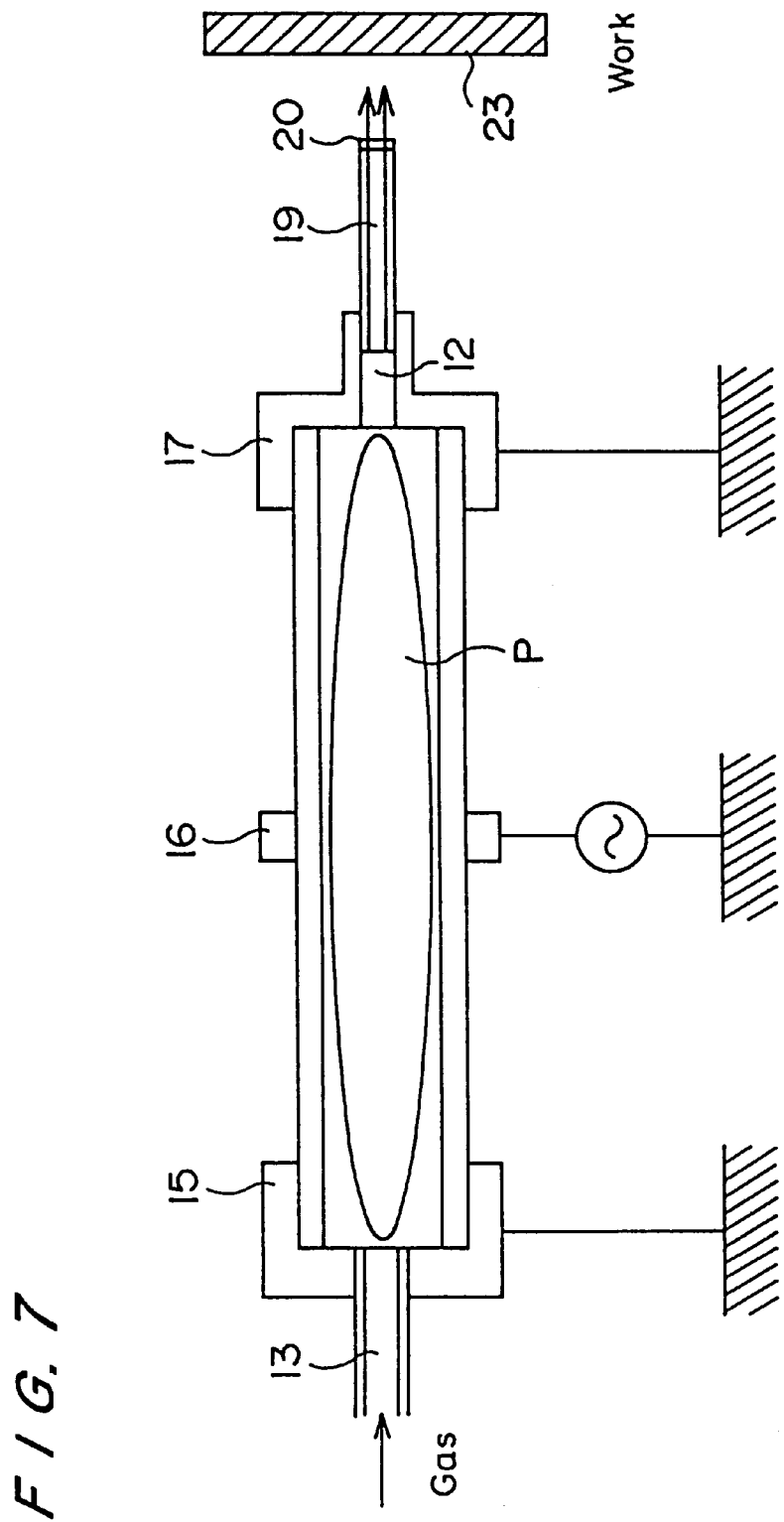
FIG. 7 is a schematic illustration of a seventh embodiment of the energy beam source of the present invention.

FIG. 7 shows a seventh embodiment of the energy beam source. This is an example of forming a local deposit or bonding using any of the sources presented above. In this embodiment, a radical discharge nozzle 19 is provided on the tip of the downstream electrode to form a local deposit. The radical discharge nozzle 19 has an inside diameter of 0.1–0.3 mm and is provided with a thin plate 20 having an opening of 0.1 nm–10 $\mu$m at a tip.

Figure 8:
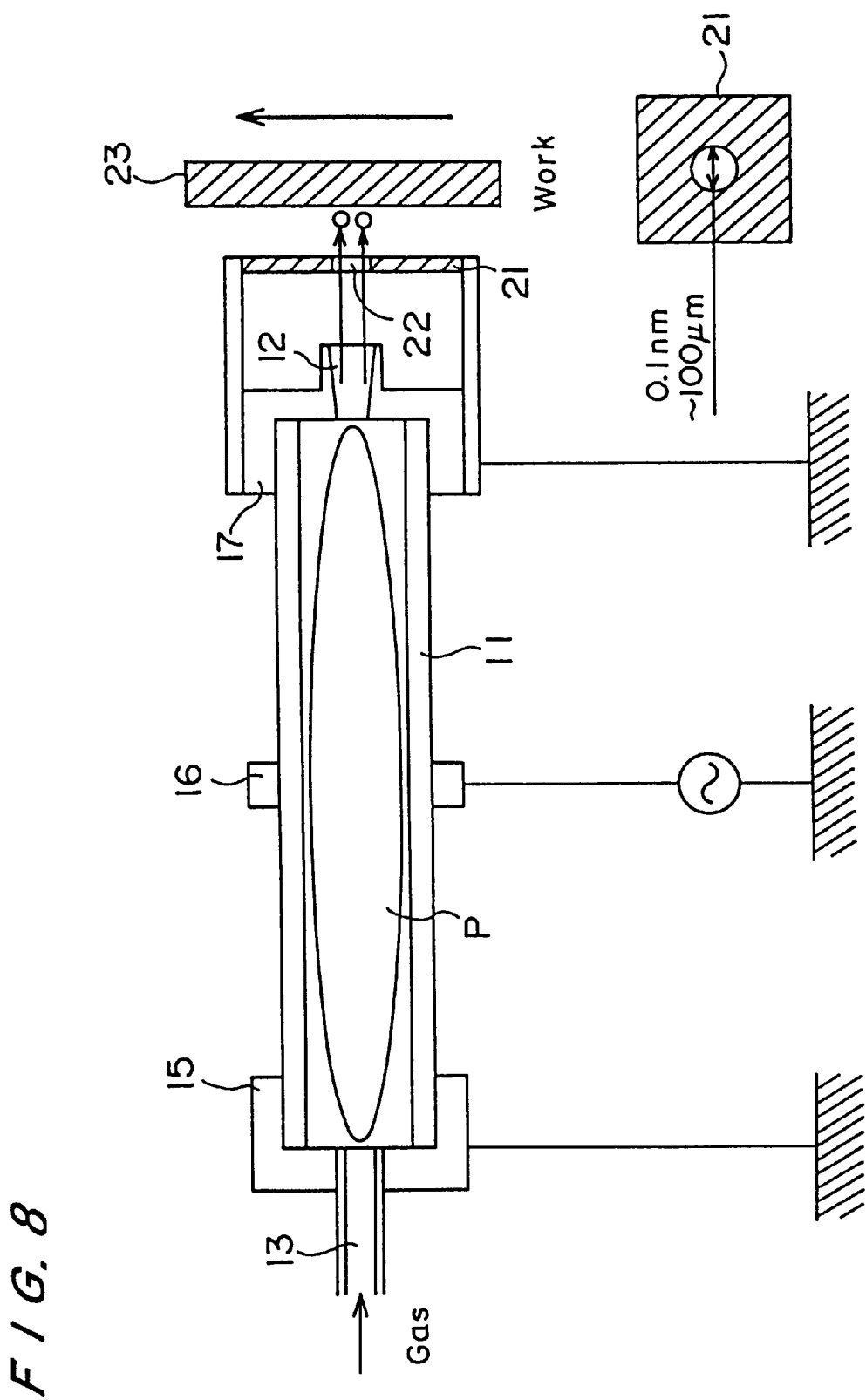
FIG. 8 is a schematic illustration of an eighth embodiment of the energy beam source of the present invention.

FIG. 8 shows an eighth embodiment of the energy beam source. In this embodiment, a patterned mask 21 is integrally provided at the tip end of the downstream electrode. The patterned mask 21 is provided with a pattern hole 22 having a certain shape or fine holes. This is used when the beam discharge opening 12 is too large or when there are several of them, to block a part of the beam downstream by passing the beam through the pattern hole 22 before the workpiece 23 is irradiated. This is useful when sputtered particles in the downstream side produce an undesirable effect on the workpiece 23.

Figure 9:
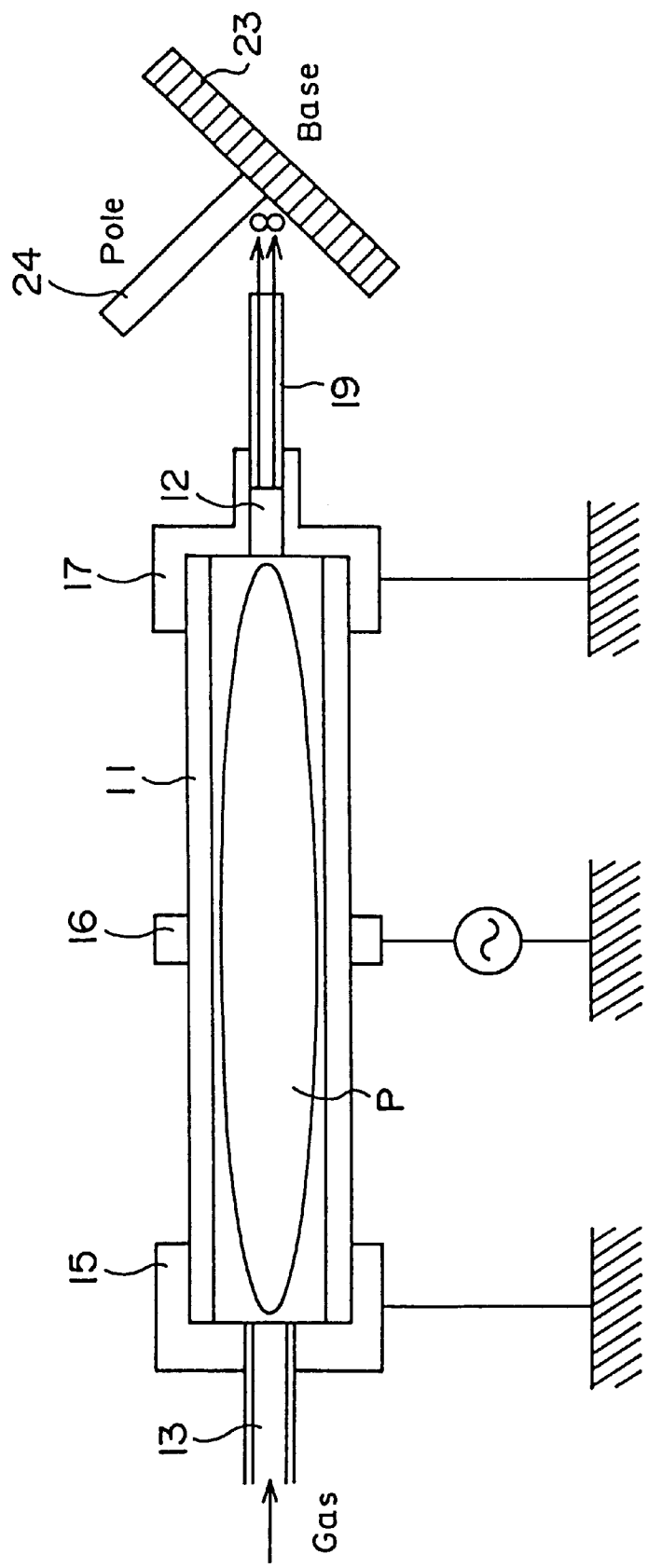
FIG. 9 is a schematic illustration of a ninth embodiment of the energy beam source of the present invention.

FIG. 9 is a ninth embodiment of the energy beam source and illustrates a fabrication process. In this embodiment, a workpiece 23 is assembled with a small rod 24, and a local deposit is formed in the assembled section to provide reinforcement of the assembled section. The diameter of the small rod 24 is about 10 nm–100 $\mu$m. A cavity is produced in the workpiece 23 with the highspeed atomic beam produced from the energy beam source presented above, and the rod is positioned in such hole by means of a micro-handling apparatus. The local deposition is made either by changing the applied voltage setting or by using another energy source. A highspeed atomic beam is radiated on the assembled section to provide reinforcement to the attachment/bonding at the assembled section.

Figure 10:
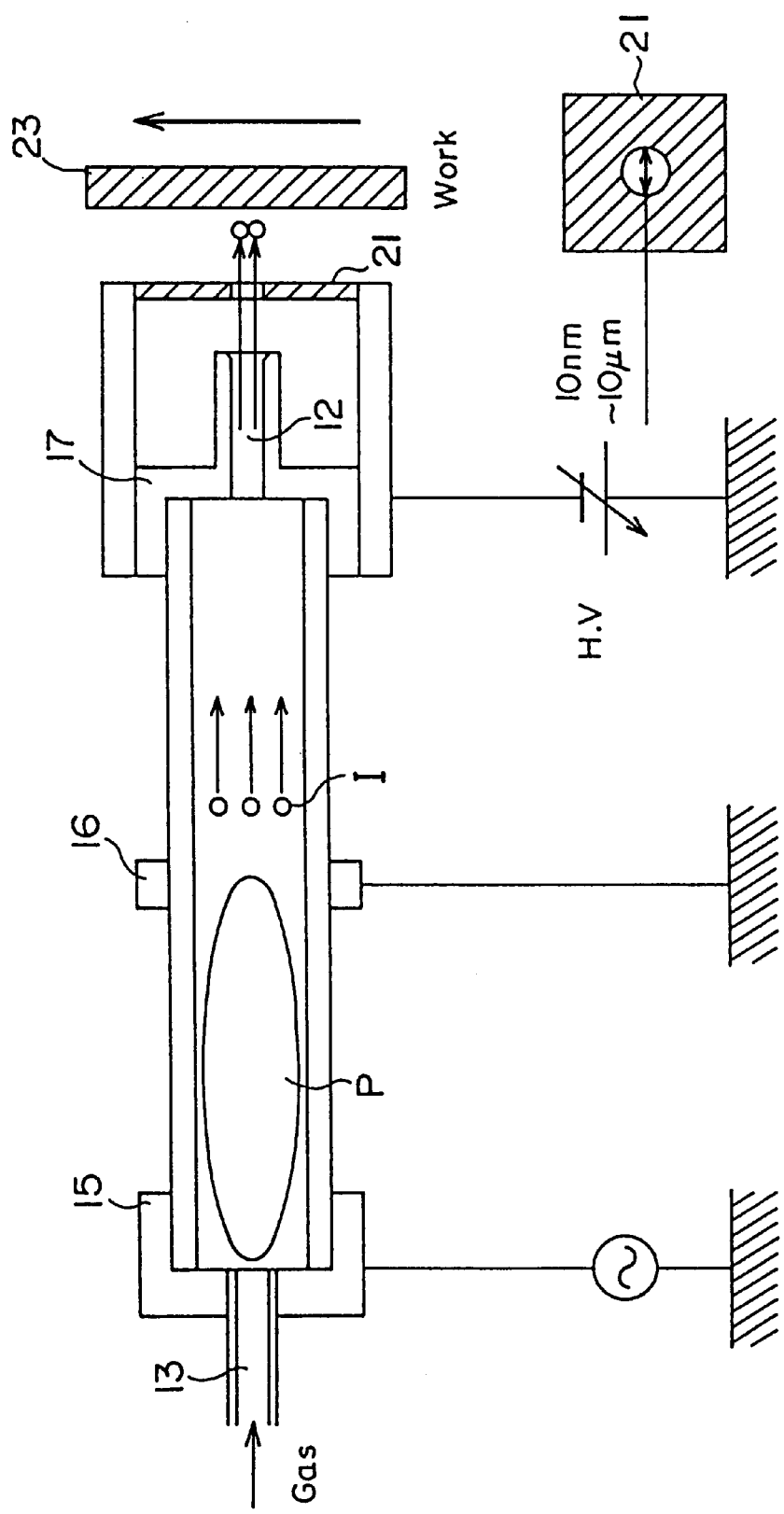
FIG. 10 is a schematic illustration of a tenth embodiment of the energy beam source of the present invention.

FIG. 10 is a tenth embodiment of the energy beam source. In this embodiment, further downstream of the downstream electrode 17, a patterned mask 21 is provided integrally with the downstream electrode 17. Highspeed atomic beam discharged from the beam discharge opening is shaped by the mask 21 according to a micro-sized pattern provided in the mask 21 and is radiated on the workpiece 23. The micro-sized holes on the mask 21 range between 0.1 nm–100 $\mu$m, and can have any type of patterns. In this embodiment, the workpiece 23 is disposed on a movable stage (not shown), and the energy beam source is fixed. Therefore, by moving the workpiece relative to the fixed radiation position of the source, it is possible to generate line, dot and other patterns or to perform micro-sized etching, i.e. material removal, in fine patterns.

Figure 11:
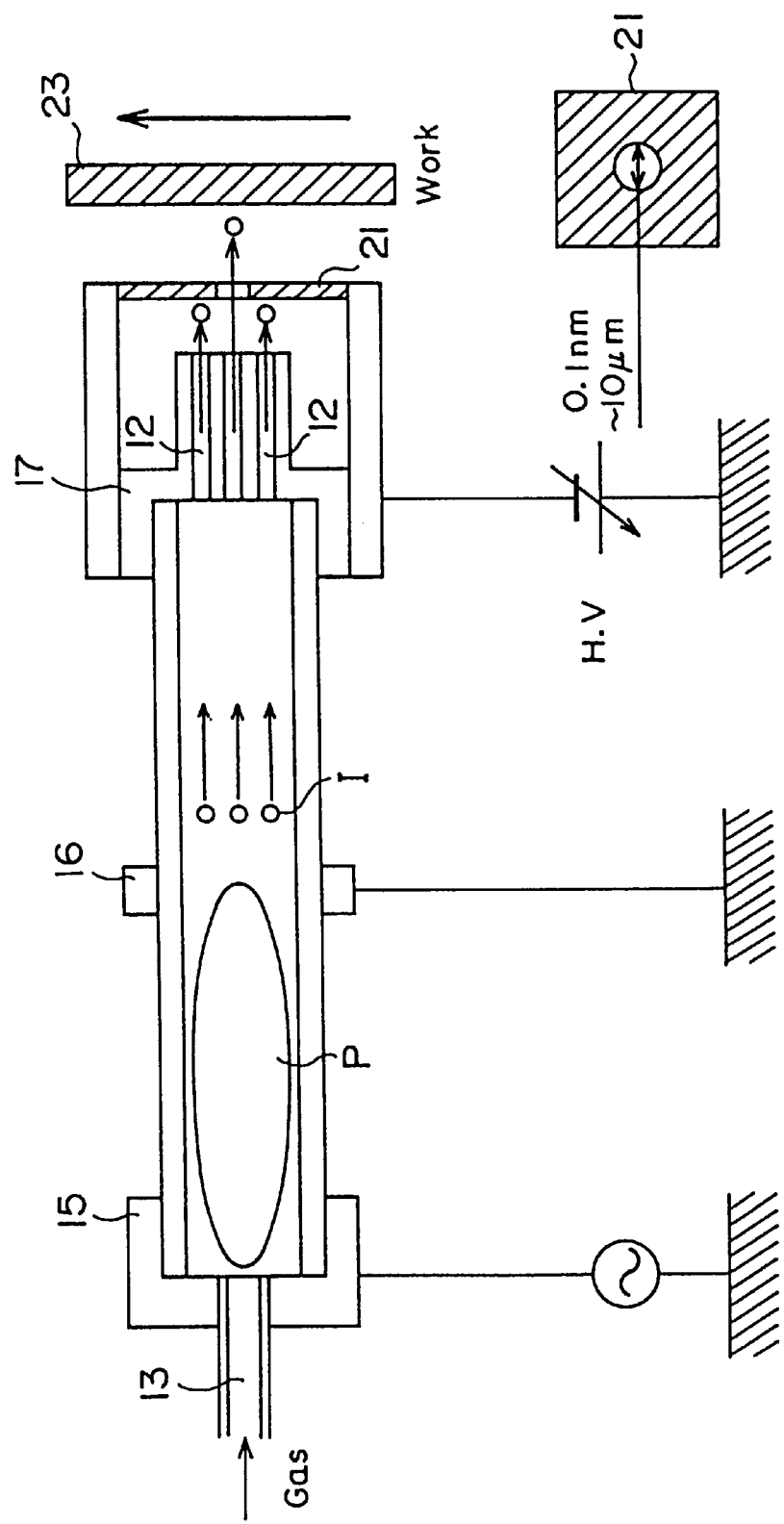
FIG. 11 is a schematic illustration of an eleventh embodiment of the energy beam source of the present invention.

FIG. 11 shows an eleventh embodiment of the energy beam source. In this embodiment, there are a plurality of beam discharge openings 12 provided on the downstream electrode 17. This source is used when there is a need for a large diameter beam. It is also useful for suppressing undesirable effects on etching which may be caused by sputtered particles from the downstream electrode 17. To suppress the undesirable effects of the sputtered particles from the downstream electrode 17 having the beam discharge opening 12, it is also effective to provide a quartz plate or a coating of oxides of silicon on the inside of the downstream electrode 17.

Figure 12:
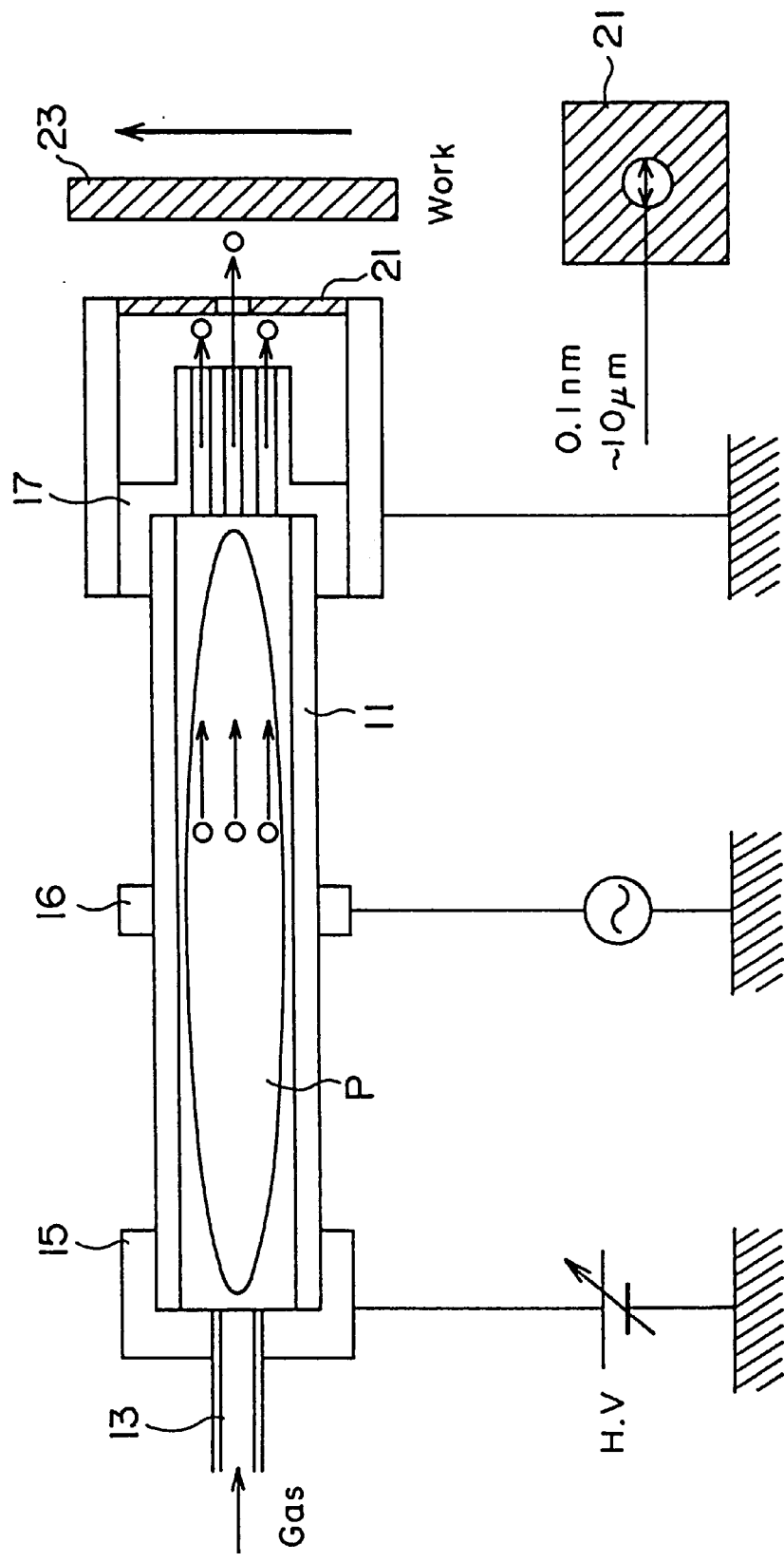
FIG. 12 is a schematic illustration of a twelfth embodiment of the energy beam source of the present invention.

FIG. 12 shows a twelfth embodiment of the energy beam source. The configuration of this embodiment is almost the same as that of the eleventh embodiment, however, in the eleventh embodiment, the high frequency voltage was applied to the upstream electrode 15 and a plasma was generated between the upstream electrode 15 and the middle electrode 16. In comparison, in this embodiment, the upstream electrode 15 is applied with a DC voltage, and the high frequency voltage is applied on the middle electrode 16. This configuration produces a plasma through the entire discharge tube 11.

FIG. 13 shows an example of performing a localized deposition process using any of the sources presented above. In this embodiment, a junction of two continuous wirings 25 is severed locally by using a highspeed atomic beam 26 from a fine diameter energy beam source 10. The connection thus is divided into two separate wirings 25A, 25B. This method is applicable to severing aluminum wiring deposited on a semiconductor substrate base, circuit wiring on printed circuits and micro-wiring on quantum devices and the like.

Figure 14:
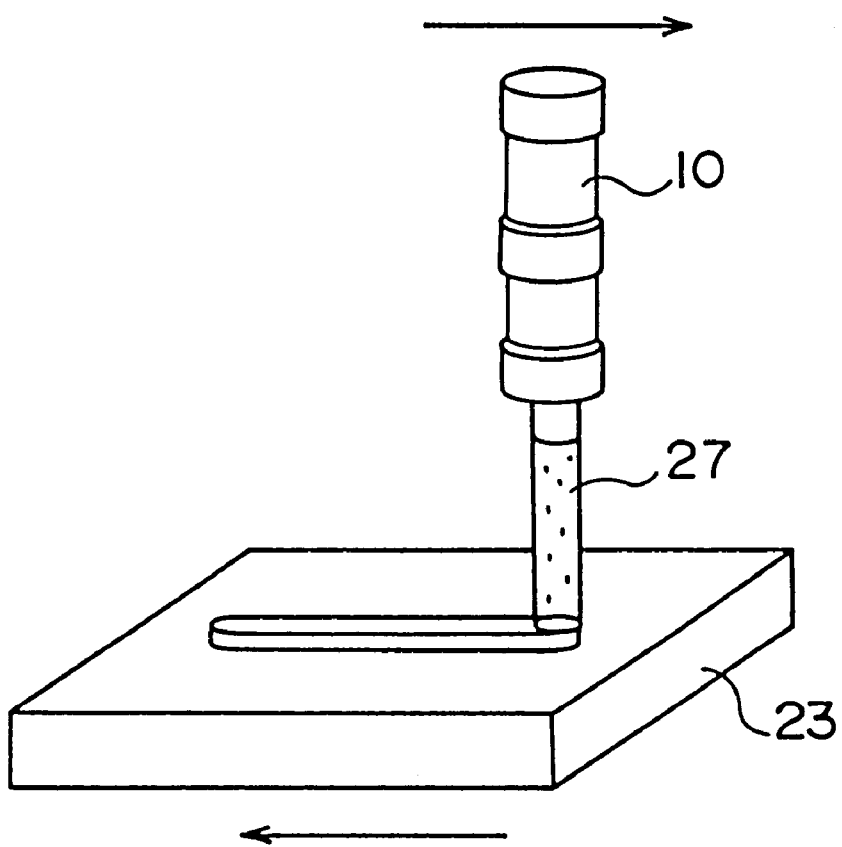
FIG. 14 is a perspective view illustrating a process of the present invention.

FIG. 14 shows local etching on a workpiece 23 performed by a radical particle beam 27 from a source 10. The example is a case of moving the workpiece 23 while irradiating the workpiece 23 with the radical particle beam 27 to provide local etching on the workpiece 23. The relative movement can be provided by moving either the source or the workpiece.

FIG. 15 shows an example of performing a localized deposition process on a separated wiring or spaces between fine structures by using radical particle beam in conjunction with film forming gases(s). As shown in this drawing, the space between the separated wirings 25A and 25B is irradiated with a radical particle beam 27 from a source 10 to form a local deposit 29 to provide an electrical connection between the wiring 25A and 25B to provide an electrical path 25.

Figure 16:
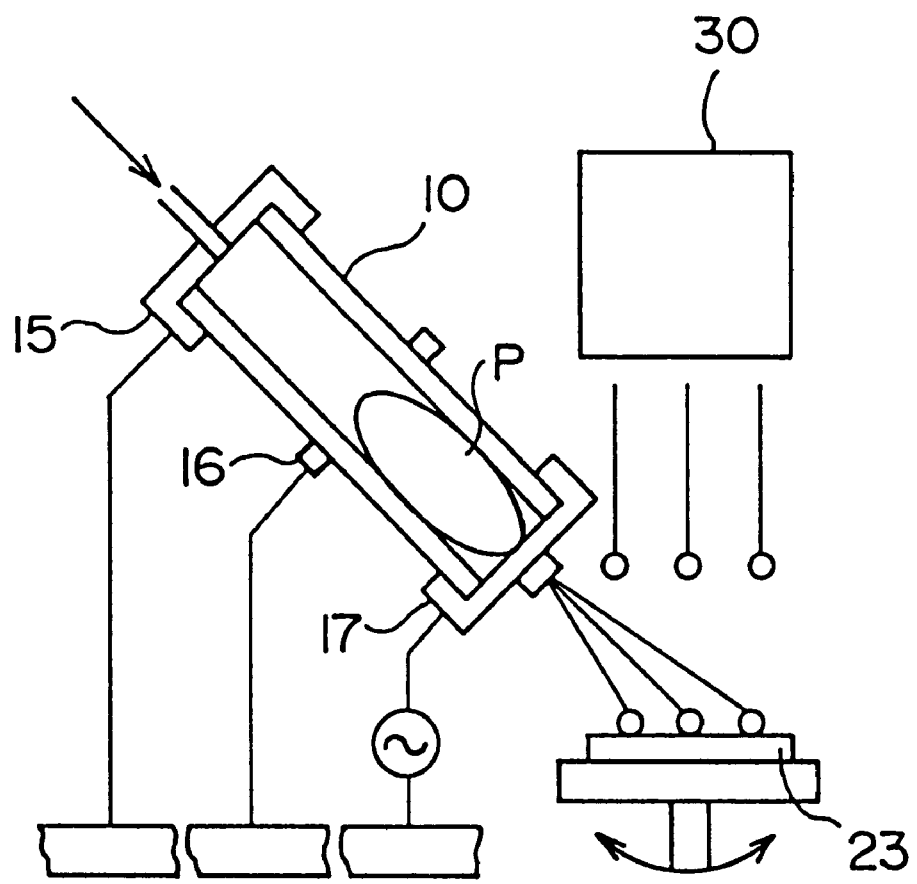
FIG. 16 is a schematic illustration of a fabrication apparatus of the present invention.

FIG. 16 shows a micro-fabrication apparatus using an energy beam source 10 in conjunction with another source 30. This is an example of using a highspeed atomic beam 30 and a radical particle beam 10.

The combined action of the atomic beam from the highspeed atomic beam 30 and the radical particle beam from the radical particle source 10 offers an opportunity to increase the etching performance significantly. The combined effects of the increased reactivity offered by the radical particle beam and the selection capability of local fabrication offered by the highspeed atomic beam provide both an increased etching speed as well as an accurate anisotropic local fabrication. In experiments carried out by the present inventors, it has been confirmed that it is possible to obtain improved etching speed of 2 to 10 times on silicon or gallium arsenide (GaAs) substrate bases, and 5 to 20 times on polyamide films.

Figure 17:
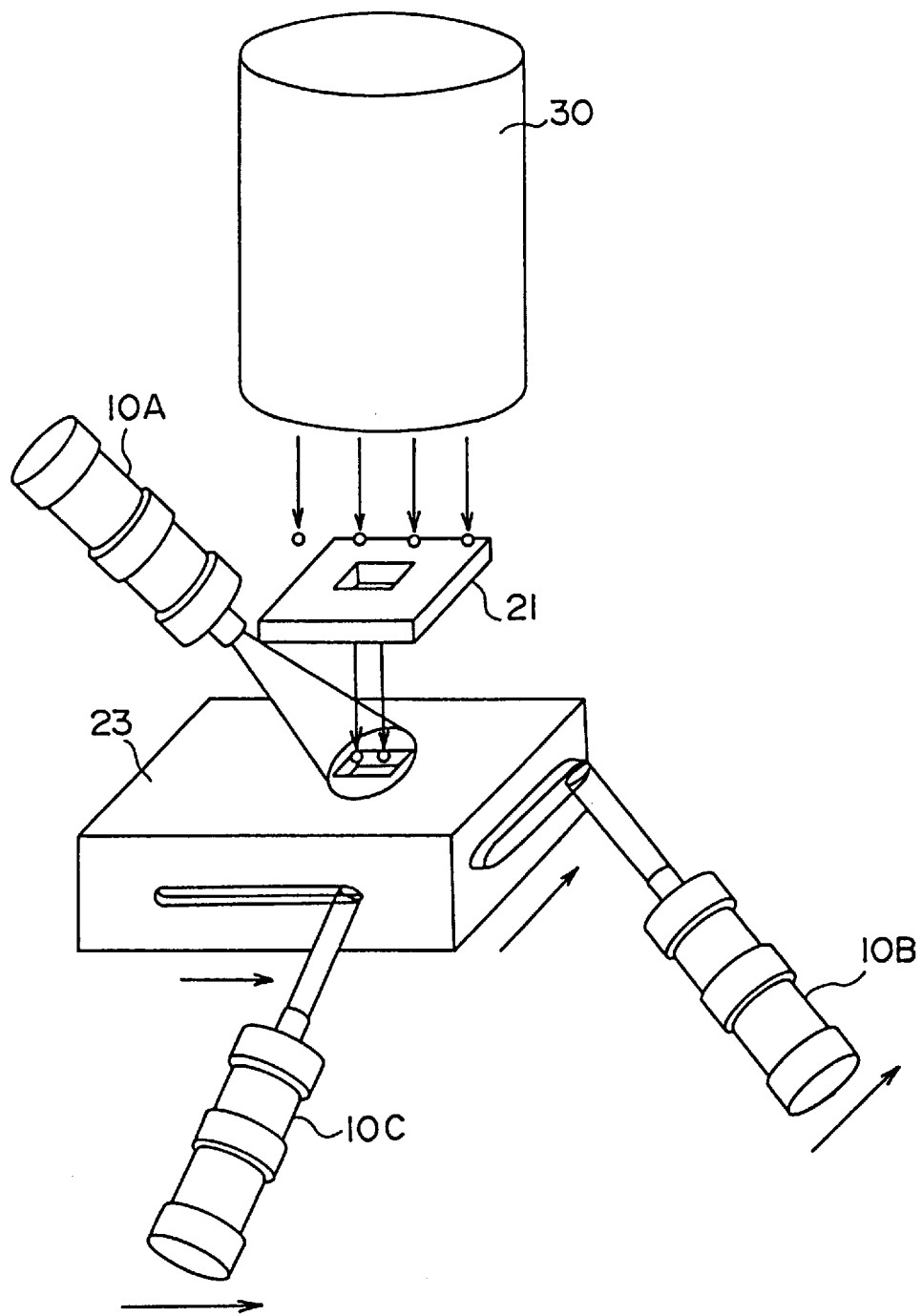
FIG. 17 is a schematic illustration of a micro-fabrication apparatus of the present invention.

FIG. 17 shows a fabrication apparatus for performing different tasks, such as etching and film deposition, on different surfaces of a workpiece 23 using a plurality of energy beam sources.

Above the workpiece 23, a highspeed atomic beam source 30 is positioned, and radiates a highspeed atomic beam on a top surface of a workpiece 23 through a mask 21. This example relates to etching of a top surface of the workpiece 23 with an atomic beam passing through the opening of the mask 21, and the pattern projected on the surface is the pattern provided at the opening, thereby performing the tasks of pattern duplication and etching of the pattern simultaneously. A compact energy beam source 10A is a radical particle source, and supplies radical particles from an inclined top location to an irradiated local spot of the highspeed atomic beam source 30. At the local spot, the etching rate is increased significantly due to the interactive effect of the highspeed atomic beam and the radical particles, and a cavity having steep side walls, for example, is produced at a high etching rate.

Also on the side surface of the workpiece 23, a compact source 10C moves while radiating a highspeed atomic beam thereon to perform an etching task to produce an extended channel along the side surface. On another side surface of the workpiece 23, a compact source 10B radiates a radical particle beam generated from a film deposition gas, and the movement of the beam along the side surface produces a fine extended (protrusion) deposit on the side surface.

The sources 10A, 10B and 10C and the like are disposed respectively on a manipulator or other rotation/translation stages to permit movement precision of a nm order. Likewise, the beams are capable of producing patterns of the order of nm sizes, as described earlier. Therefore, by utilizing a plurality of sources disposed in such a way to permit irradiating a workpiece from a plurality of directions, it is possible to produce extremely fine patterns in a three-dimensional space.

In this embodiment, the example related to a case of fabricating different patterns on three surfaces, but it is also possible to carry out sequential fabrication following a certain sequencing schedule. It is naturally permissible to carry out one type of fabrication on each surface of a workpiece.

The sources 10A, 10B and 10C are able to perform different processes, such as etching and film deposition, by choosing suitable operating voltages to be applied to the upstream, middle and downstream electrodes and selecting suitable process gas species to be admitted into the discharge tube. For example, a process schedule such as light etching of a side surface to expose a clean surface, followed by depositing of a fine line protrusion on the cleaned surface can readily be carried out using the source of this invention.

Some of the salient features of the energy beam source of the present invention will be reviewed in the following. The source is designed to have at least three electrodes each of which can be supplied with a DC voltage, a high frequency voltage or a ground voltage. The electrode to be used for high frequency voltage application can be the capacitively coupled type or inductively coupled type. The inductively coupled type uses a coil electrode. The high frequency source is not particularly limited, the choice being made on the basis of end application, and usually a frequency of 13.56 Hz is employed. For example, use as a radical particle source would require the downstream or middle electrode to be supplied with a high frequency voltage so that the generated radical particles would be accelerated due to a pressure differential and discharged from the beam discharge opening.

When the downstream electrode is supplied with a high frequency voltage, electron activity occurs also at the downstream electrode, and the activation effect on the gas particles is increased. Also, the energy beam source enables selection of whether to accelerate positive ion particles or negative ion particles in the plasma by applying either a high voltage or a low voltage to the beam discharge electrode. The accelerated ion particles undergo charge exchange with the residual gas particles in the beam discharge opening, and are emitted therefrom as a highspeed atomic beam containing neutral charge particles.

The dimensions of the beam discharge opening diameter and its length, providing an aspect ratio of the discharge opening, are critical factors in determining the properties of the energy beam. When the source is to be used to perform localized micro-fabrication, the diameter of the beam discharge opening is important, and for this purpose the diameter must be in ranges of 0.1–10 nm, 10–100 nm or 100 nm–10 $\mu$m. The length of the opening significantly affects the character of the discharged beam, and therefore, the length must also be chosen to suit the application. For example, when the length is within 1–5 times the diameter of the opening, the highspeed atomic beam comprises electrons, ions, radicals and moderately neutral particles. The discharge beam expands downstream so that it is possible to irradiate a circular area of 10–50 times the diameter of the opening. When the length is within 5–10 times the diameter, the directionality of the beam is excellent, and it is possible to localize the irradiation area. In this case, the neutralization factor of the high-speed atomic beam within the opening is increased to about 30–70% of the total particles. When the length becomes longer than 10 times the diameter, the beam directionality is further improved and the neutralization factor is also increased to about 70. This type of highspeed atomic beam is excellent for fabrication of an extremely fine localized area.

The source is designed to be compact and the operating parameters can be freely varied by selecting an appropriate operating voltage to be applied to the electrodes. The electrodes are connected to lead-in terminals of the vacuum vessel which are connected through flexible coaxial cables to an outside control unit/on the atmospheric side. Therefore, by simply changing the input terminal cables, it is possible to select the type of voltage to be applied to the electrode, thereby providing a beam of desired energy level and particle type.

A single source or plural sources may be located inside the vacuum vessel and may be mounted on a manipulator or rotation/translation stage so as to permit various types of fabrications to be carried out, such as etching, film deposition, bonding and attaching, either simultaneously or serially on any surface of a workpiece. The workpiece itself may be mounted on a manipulator or rotation/translation stage so as to perform fabrication on a plurality of workpiece surfaces. The manipulator or rotation/translation stage is designed so that it may be operated from the outside control unit.

The source can be used to perform local fabrication, such as local film deposition/etching and the like, or bonding/attaching of more than two fine objects. To improve the beam directionality and the definition of the fine beam to produce fine patterns, a mask having micro-patterns is disposed integrally on a downstream beam source, thereby enabling transfer of patterns to a workpiece without using conventional photomasking and the like.

Such an integral masking is useful in preventing undesirable effects of sputtered particles generated from the discharge electrode in the discharge tube. This can be prevented by having a plurality of beam discharge openings to reduce the amount of sputtered particles, and carrying out local fabrication with the use of the integral patterned mask to control the beam shape and diameter.

For bonding/attaching applications, positioning and fabrication of a plurality of fine workpieces may be carried out under a light microscope, laser microscope, SEM and the like magnifying means.

Figure 18:
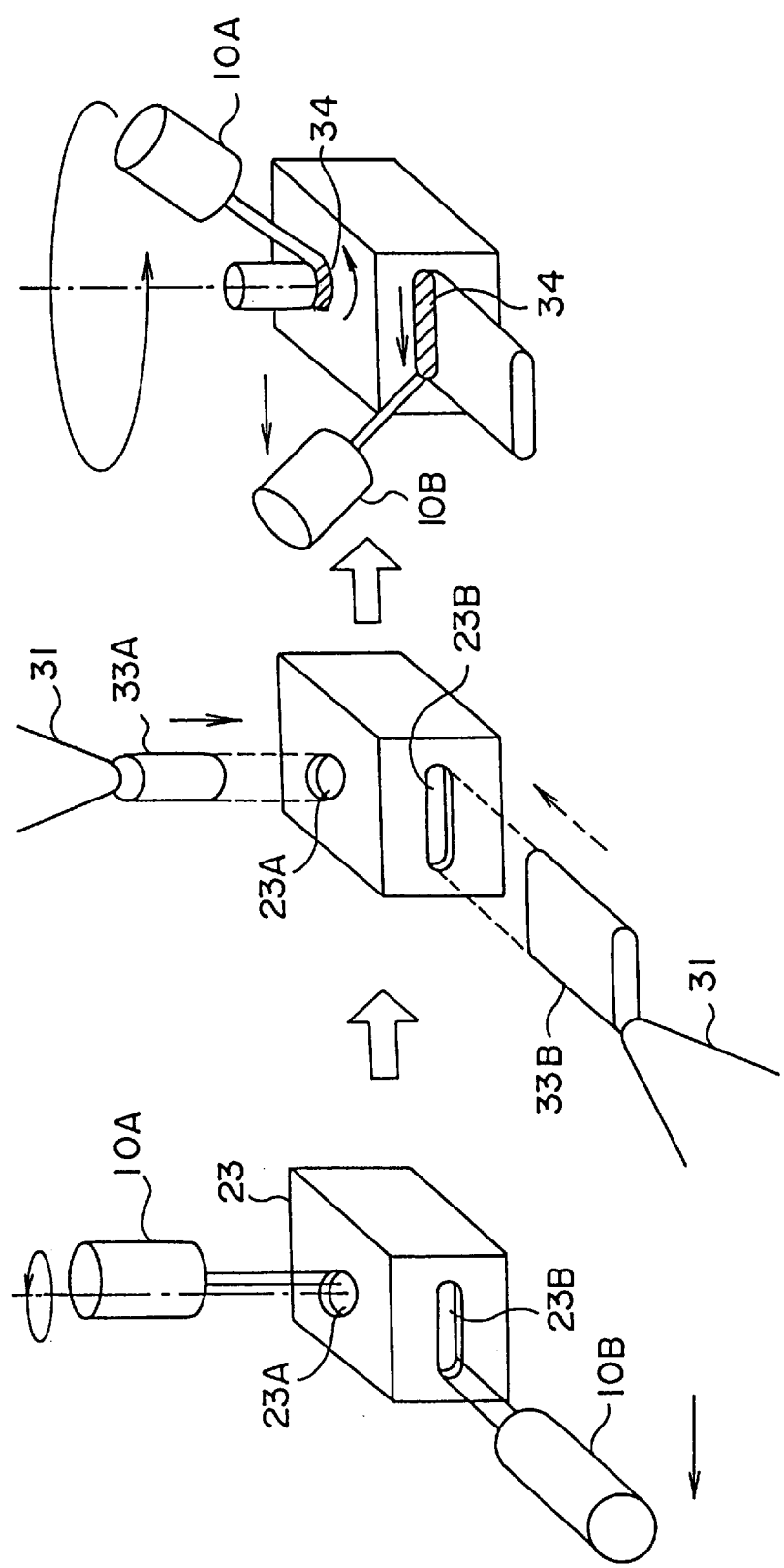
FIG. 18 is a schematic illustration of a micro-fabrication apparatus of the present invention.

FIGS. 18 and 19 show a method of performing three-dimensional fabrication of a workpiece.

For a new workpiece 23, assembly operations may involve, for example, making recesses or openings 23A, 23B using sources 10A, 10B. Here, the workpiece 23 is a silicon single crystal or a polyamide resin. For assembly, a manipulator 31 is used to insert a rod piece 33A made of stainless steel of a diameter of 300 $\mu$m, for example, into the opening 23A. A plate piece 33B, made of a silicon single crystal, is inserted into opening 23B using the manipulator 31. A bonding operation may require revolving of the source 10A in a cone shaped path around the workpiece 23 and radiating a reactive radical particle beam to the joint area between the opening 23A and the rod piece 33A. Similarly, by translating the source 10B, a reactive radical particle beam is radiated on the joint between the plate piece 33B and the opening 23B. Irradiation with the reactive radical particle beam produces a bonding agent 34, a local film deposit, at the joint area to join two different materials, thereby bonding the workpiece 23 to the rod piece 33A and the plate piece 33B.

FIG. 19 illustrates the process of irradiating the joint area between the rod piece 33A into the opening 23A with the radical particle beam to provide the bonding agent 34 for bonding the two pieces.

Aligning of the insertion pieces and the beam is carried out while observing the pieces under a SEM or light microscope and operating a manipulator or a rotation/translation stage, capable of providing micro-alignment, having the insertion object or the source mounted thereon. In this embodiment, the compact source is mounted on a rotation/translation stage, and irradiates the joint area with a beam oriented at a suitable angle. Conversely, the position of the source may be fixed, and the pieces may be mounted on a rotation/translation stage.

The beam source for such a fine diameter beam may be a film-forming type of reactive radical particle beam or low-energy highspeed atomic beam. For example, by using methane as the process gas for the source, a radical beam having carbon (C) particles is generated, and the bonding agent 34 formed may be graphite or diamond-like carbon.

In addition to methane mentioned above, the process gas may include tungsten fluoride, aluminum chloride, titanium chloride and the like gases containing metallic components or carbon group or hydrocarbon group gases and the like process gases containing C or C—H. The bonding agent formed at the joint area includes a film deposit of tungsten, aluminum, titanium, graphite, diamond-like carbon and polymeric films containing hydrocarbons. This is an example of the methods of joining components of two different materials, which primarily are mostly carried out under vacuum.

Reviewing the method of three-dimensional micro-fabrication using the energy beam source of the present invention, the following salient features are noted.

(1) A micro-component made of two different materials may be bonded or attached in a vacuum;

(2) Heating is local and there is no need to heat the entire workpiece;

(3) A plurality of micro-components can be bonded or attached in a vacuum;

(4) Fabrication may be carried out even on a complexly shaped workpiece.

Conventional methods of bonding require that the entire workpiece should be heated to a temperature over 100 degrees in an evacuated environment, thus excluded the application of the method to polymeric materials. For semiconductor devices, elevated temperature heating would lead to loss of device performance. The method using the energy beam source of the present invention enables production of a three-dimensional structure without generating such problems.

The energy beam source of the present invention and the method of fabrication using the same now will be compared with conventional methods.

The traditional photolithographic method involves steps which are cumbersome because of the necessity of preparing photoresist patterns requiring such steps as rinsing, resist coating, exposure, baking and development of the image. There are occasions when uniform resist patterns cannot be made because of problems of roughness and flatness of the substrate base. As for the method without using photoresist, there is a problem of limited degree of freedom in fabrication patterns, and only one pattern is made for one device design, so if a different pattern is needed, another pattern must be generated. A degree of freedom of fabrication, such as to enable previewing the surface condition of a wafer and deciding on the regions to be used for fabrication or three-dimensional fabrication on a workpiece, have not been possible. Furthermore, the conventional sources of ion or electron beams are fixed on a flange of a vacuum vessel, and although a certain degree of control over the irradiation area is possible by moving the workpiece, such is limited basically to two-dimensional movement. Furthermore, when performing etching or film deposition, a separate gas supply facility must be made available, and because the number of reactive gas particles is few, fast fabrication speed cannot be expected.

In the present invention, it is possible to vary the energy beam source and the type of voltage to be applied to the discharge electrodes inside the compact source. Therefore, a compact beam source can be used as a radical particle beam source or as a high speed atomic beam source. Because the relative alignment of the radical beam source or high speed atomic beam source can be controlled with the use of a manipulator or a rotation/translation stage, it is possible to perform any desired fabrication on any surface of a workpiece. Because the source is a compact source, a plurality of sources may be utilized simultaneously or serially to perform different fabrication operations on the same surface of the workpiece. Because the source is capable of radiating a reactive process gas directly, the fabrication speed is much faster than those utilizing a separate ion beam or electron beam in conjunction with a gas feed facility. For micro-fabrication applications, a beam discharge opening can be selected to suit the application requirements, for example, in three ranges of 0.1–10 nm; 10–100 nm; and 100 nm to 10 $\mu$m. It is also possible to use a mask having the desired holes or patterns integrally provided on an energy beam source for use in fabricating local areas of a workpiece. Localized etching, film deposition, bonding and attaching processes can be undertaken to realize fabrication of a three-dimensional structure which has been extremely difficult using the conventional approach. The availability of the compact energy beam source has thus opened a new path to such leading-edge industries as repair of semiconductor devices, circuit alteration/repair and micro-machining of ultrasmall components for medical devices.

Figure 21:
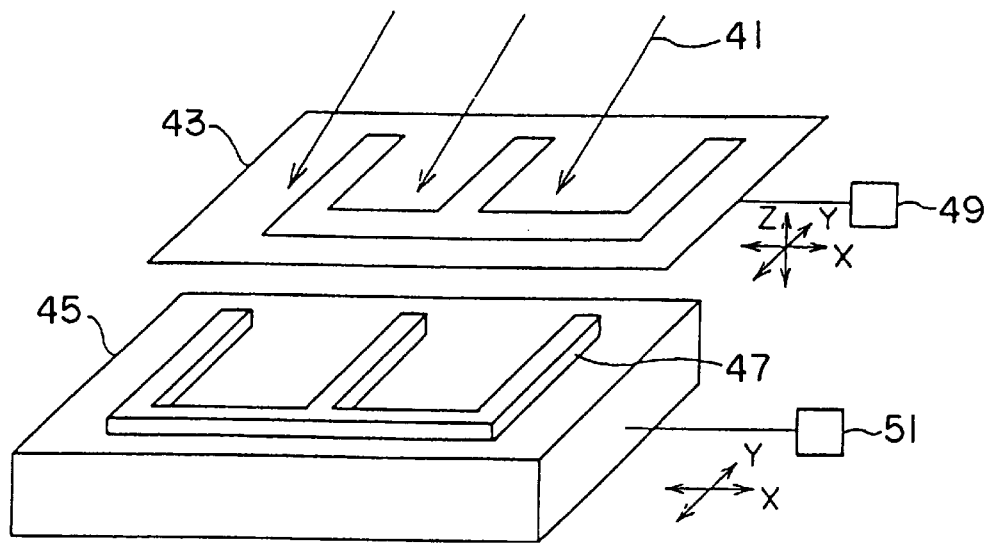
FIG. 21 is a perspective view of a process of the present invention.

FIG. 21 shows a method of forming a film deposit 47 by irradiating a workpiece 45 with a low-energy beam 41, in association with a film forming gas, through a mask 43 having a hollowed-out pattern to produce film deposit 47 of the same design on the workpiece 45. The low-energy beam 41 may include a low-energy atomic beam, an ion beam, a molecular beam and an atomic beam and the like beams associated with film-forming gases. The energy levels may range between 0.1–200 eV, and the beam diameter may range between 1 $\mu$m to 300 mm.

The mask 43 may include electro-formed patterned masks, wet etched stainless steel masks, excimer-laser fabricated masks or higher precision masks such as Ni masks produced by a laser ionic gas attack (LIGA) process.

Film-forming gas can be chosen to suit the workpiece but may include methane, aluminum chloride, silicon tetrachloride, tungsten fluoride, suitably diluted with argon or helium. The films which can be made by the method include metals, ceramics, resins and polymers and their composite material, and the process gas may be any gas or vapor of appropriate compositions.

The deposition process of making a film deposit 47 comprises main steps of aligning mask 43 with the workpiece 45 mounted on respective positioning devices 49, 51 (for distance, parallelism and relative positioning etc.), and irradiating the workpiece 45 with the low-energy beam 41 through the openings on the mask 43.

In FIG. 21, the illustration shows the mask 43 is moved along the X-, Y- and Z-axes and the workpiece is moved along the X- and Y-axes. However, the mask and the workpiece may be rotated about at least one of the X- and/or Y-axes. It is not necessary that both workpiece and the mask be moved, but that only one of them be moved.

Figure 22:
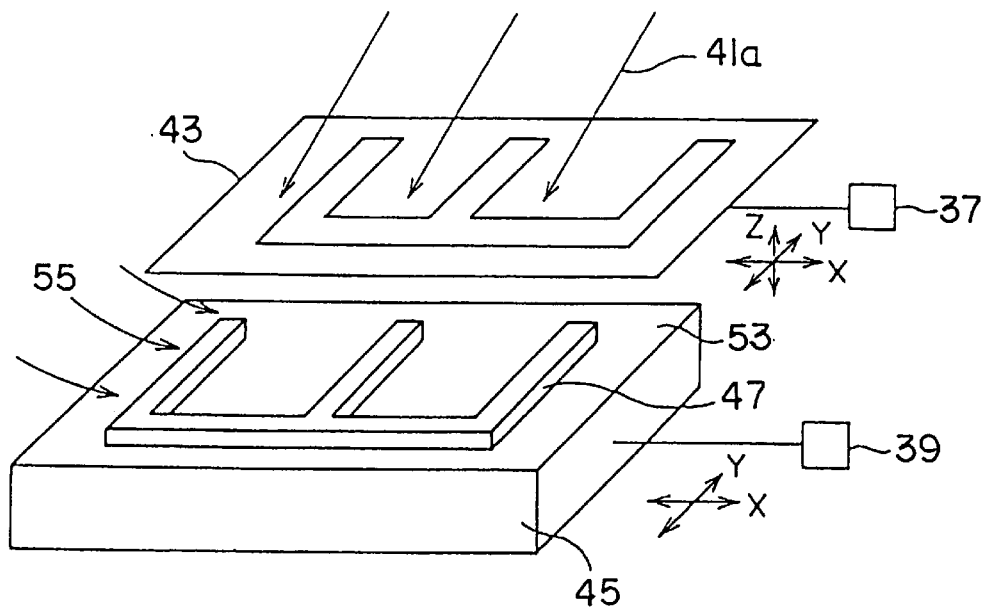
FIG. 22 is a perspective view of a process of the present invention.

FIG. 22 shows use of an electron beam as a low-energy beam 41a. In this case, a film-forming material 53 may be pre-coated on the surface of the workpiece 45 or a film-forming gas 55 may be supplied with the electron beam 41a. By coating the film-forming material 53 or directing the film-forming gas 55 on the surface of the workpiece 45, and radiating the electron beam 41a through the mask 43, the film-forming material or the film-forming gas are activated on the surface of the workpiece, and a deposit 47 having the same pattern as the mask is produced on the workpiece.

In this case, the mutual movement of the mask and the workpiece requires that only one is moved with respect to the other.

Figure 23:
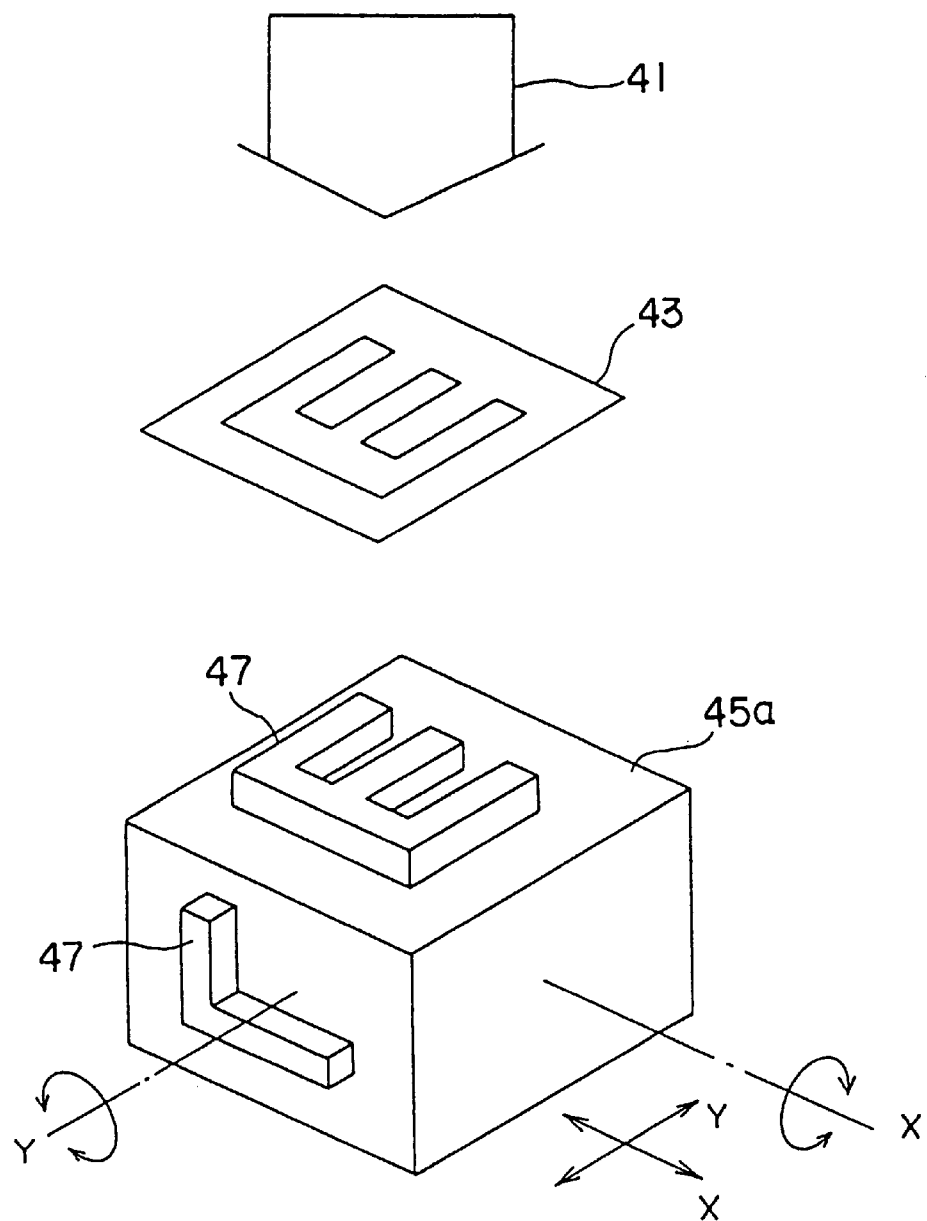
FIG. 23 is a perspective view of a process of the present invention.

FIG. 23 shows an embodiment employing multi-axial movement. A workpiece 45a disposed on a positioning device (not shown) is translated along X- and Y-axes as well as being rotated about the X- and Y-axes so as to produce a film deposit 47 on any surface or any location of the workpiece 45a. The workpiece 45a can also be moved along the Z-axis or rotated about the Z-axis. In addition, a beam source 41 and/or a mask 43 can be translated at least along one axis of the X-, Y- and Z-axes as well as rotated about one of the X-, Y- and Z-axes with the workpiece located at the center of revolution.

In the embodiment shown in FIG. 23, if an electron beam is used as the low-energy beam 41, a film-forming material 53 may be coated on the workpiece 45a beforehand or a film-forming gas 55 may be used with the electron beam, as in the embodiment of FIG. 22.

Figure 24:
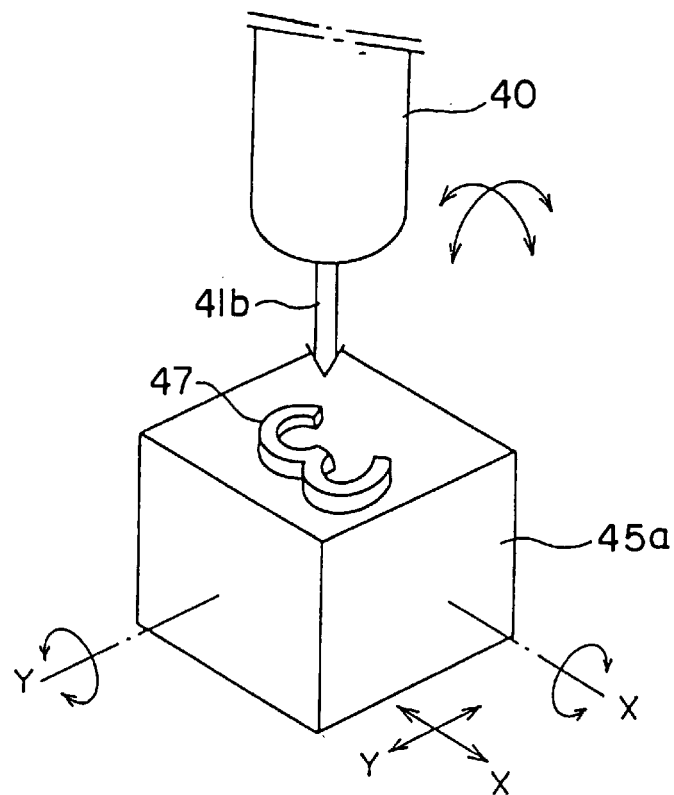
FIG. 24 is a perspective view of a process of the present invention.

FIG. 24 shows an embodiment wherein the radiation is a converging beam 41b which is irradiated directly onto the workpiece 45a without using a mask. The workpiece 45a is mounted on a positioning device (not shown) and is translated along and rotated about the X- and Y-axes, and the beam source 40 is rotatable about the X- and Y-axes. The diameter of the converging beam includes a 0.1–10 nm range; a 10 nm–1 μm range; or a 1–100 μm range, and preferably a 10 nm–1 μm range. By translating the workpiece 45a and the beam source 40 along the X- and Y-axes as well as rotating about the X- and Y-axes, any pattern may be formed on any surface or location of the workpiece 45a.

In this embodiment also, if an electron beam is used as the low-energy beam 41b, then a film-forming material may be coated on the workpiece beforehand or a film-forming gas may be directed along with the electron beam.

Figure 25:
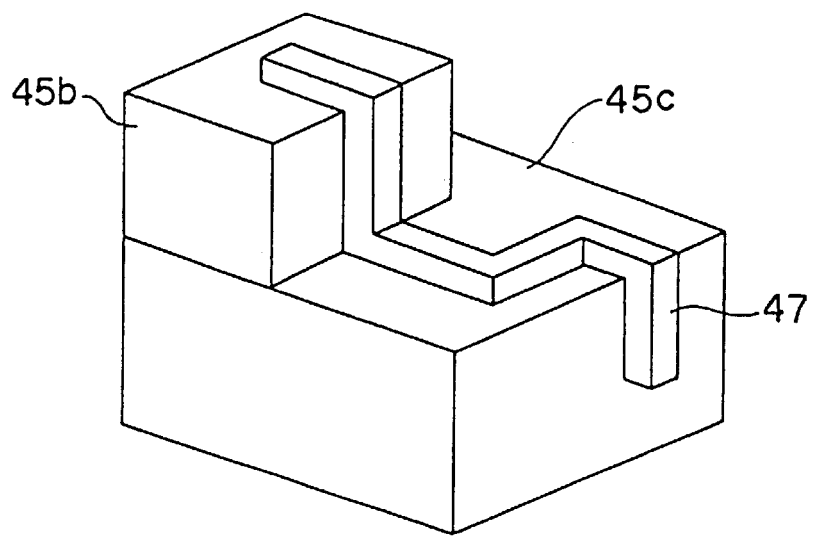
FIG. 25 is a perspective view of a product formed according to the invention.

FIG. 25 illustrates an example of using the method of forming a film deposit shown in FIG. 24 to produce a film deposit 47 having the desired pattern on plural surfaces of a complexly shaped, stepped three-dimensional workpiece made by assembling two micro-parts 45b, 45c.

Figure 26:
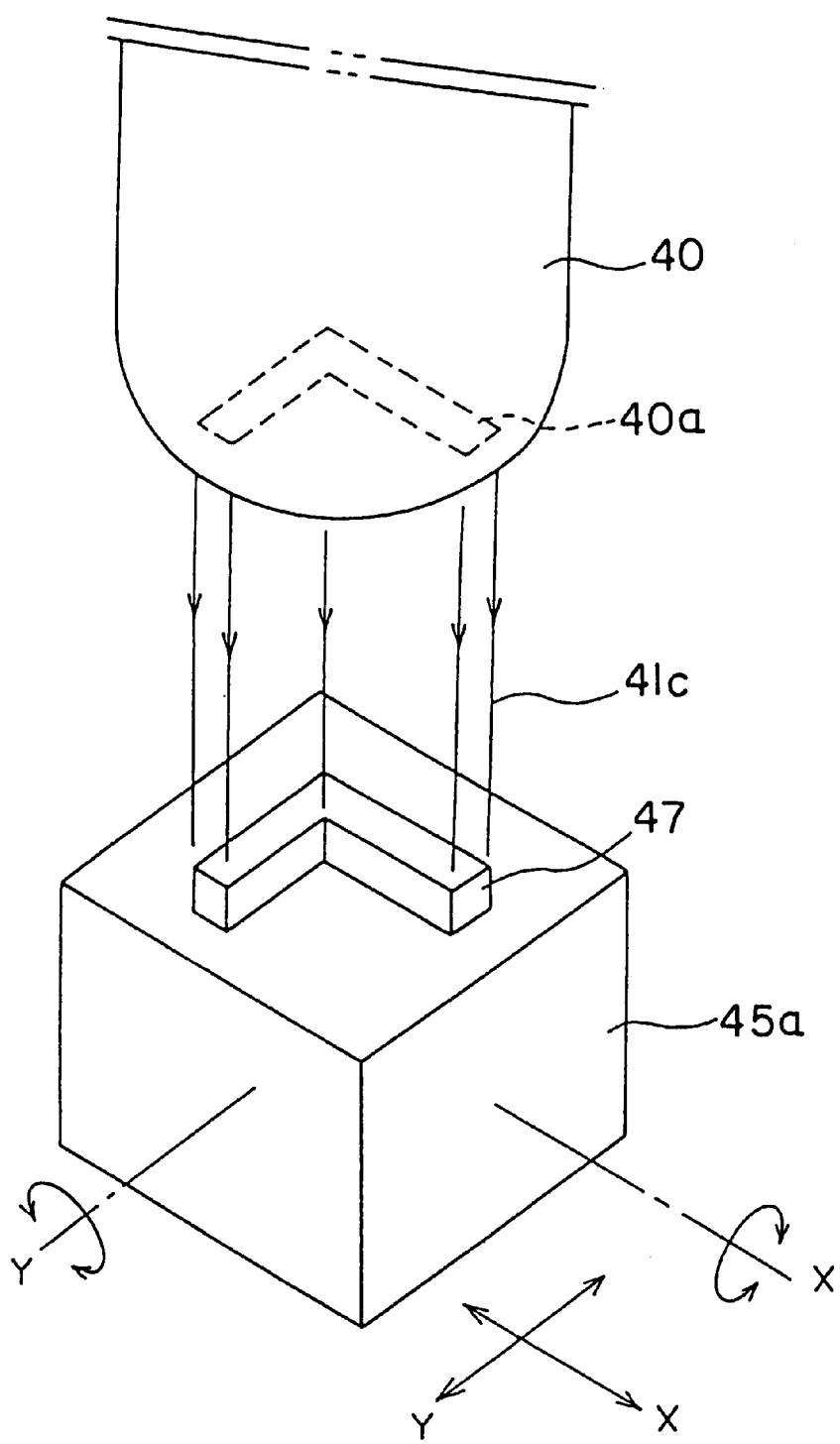
FIG. 26 is a perspective view of a process of the present invention.

FIG. 26 shows an embodiment wherein a beam 41c radiated from a beam source 40 has a certain shape, and the workpiece 45 is able to translate along as well as rotate about the X- and Y-axes. Therefore, without using a mask, a film deposit 47 having any desired pattern may be formed on any surface or location of the workpiece 45a. The shaped beam can be generated by shaping the electrode 40a of the beam source 40 in the desired pattern.

Figure 27:
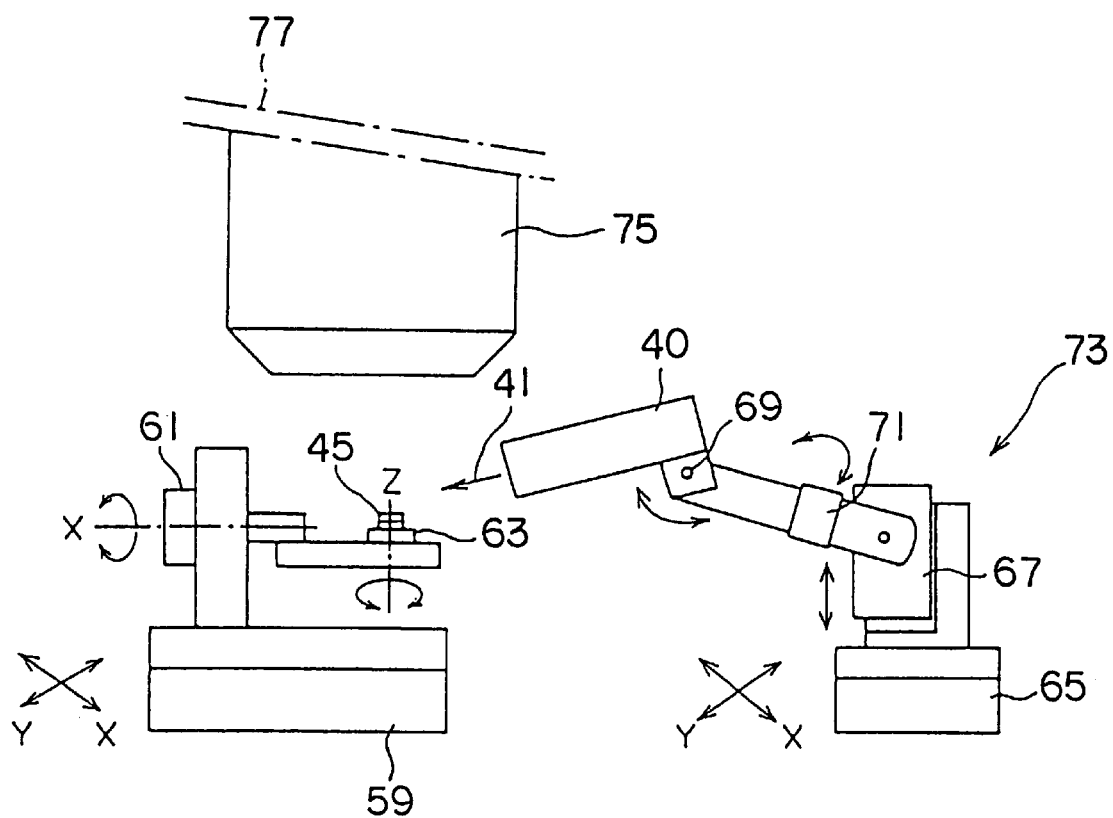
FIG. 27 is a schematic view of a system for performing the method of the present invention.

FIG. 27 shows an example of a system for forming a film deposit according to the present invention. In this system, the workpiece 45 is able to translate along the X- and Y-axes by means of an XY-stage 59 as well as rotate about the X- an Z-axes passing through the center of the workpiece 45 by means of a rotation device 61, 63 provided on the X-Y stage 59. The beam source 40 is able to translate along as well as rotate about the X-, Y- and Z-axes by means of a manipulator 73 including an XY-stage 65, a Z-stage 67 and rotation devices 69, 71. In this embodiment, the beam source 40 has a converging beam having a diameter of 0.1 nm–100 μm. When using the mask shown in FIGS. 21–23 and 26, a non-convergent beam having a beam diameter of 1 μm–300 mm may be used.

Furthermore,, because the workpiece 45 is micro-sized and is difficult to be positioned with unaided eye, a magnifying means 75 such as a light microscope, laser microscope or SEM and the like may be used to provide accurate information on film location and deposition conditions.

Film deposition process is generally performed in an evacuated vessel 77 having XY-stage 59 for holding the workpiece, manipulator 73 for the beam source and magnifying means 75 disposed therein. Process control, such as positioning of the workpiece and the beam source, is carried out from outside the vessel 77.

Figure 28:
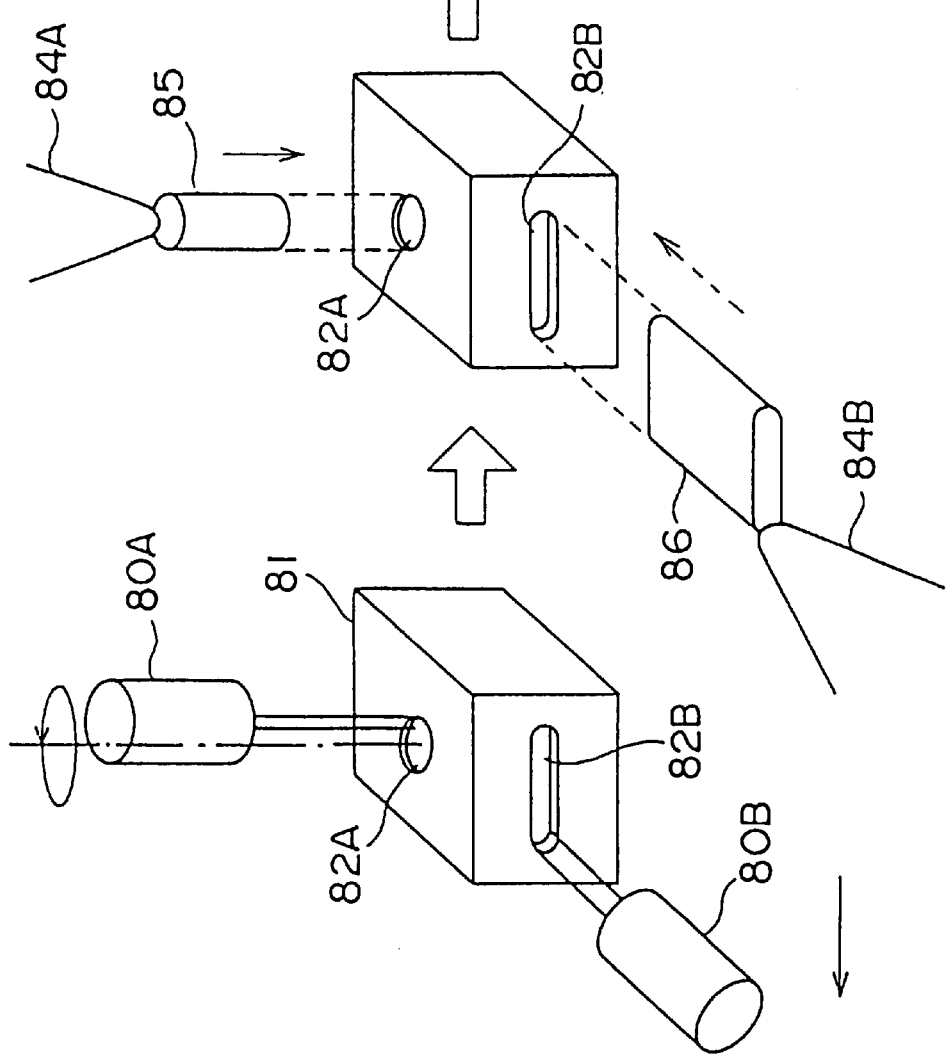
FIGS. 28A–28C are perspective views of a twenty-fourth embodiment of the energy beam source of the present invention.
Figure 29:
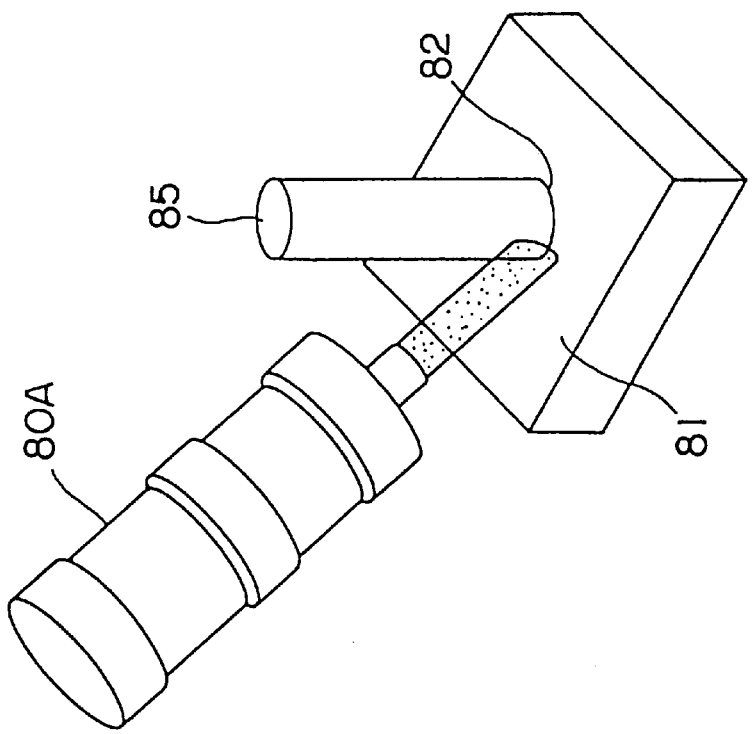
FIG. 29 is an illustration of a bonding step in FIG. 28C.

FIGS. 28A–29 show a method of micro-fabrication in a three-dimensional space.

The processing steps are divided into three fabrication stages: stage A, stage B and stage C. In stage A, microsized opening 82A, 82B are formed on a workpiece 81 using beam sources 80A, 80B. In this embodiment, the workpiece 81 may be represented by a silicon single crystal or a polyamide resin material. In stage B, a stainless steel rod piece 85 of a diameter of 300 μm, for example, is inserted into the opening 82A using a manipulator 84A. Also, a plate piece 86 of a silicon single crystal, for example, is inserted into the opening 82B using a manipulator 84B. In stage C, the joint area between the rod piece 85 and the opening 82A is irradiated with a radical particle beam of a reactive gas generated from a beam source 80A which is rotated in a cone shaped path about the Z-axis as illustrated in FIG. 28C. Similarly, the joint area between the plate piece 86 and the opening 82B is irradiated with a radical particle beam source by moving the beam source 80B parallel to the surface of the workpiece 81. The irradiation process with the radical particle beam produces a bonding agent 87 to bond different materials, manifested in this embodiment by the workpiece 81, the rod piece 85 and the plate piece 86.

FIG. 29 is an illustration of the process of irradiating the joint area with a radical particle beam to form local bonding agent (deposition) 87 between the workpiece 81 and the inserted rod piece 85.

Figure 30:
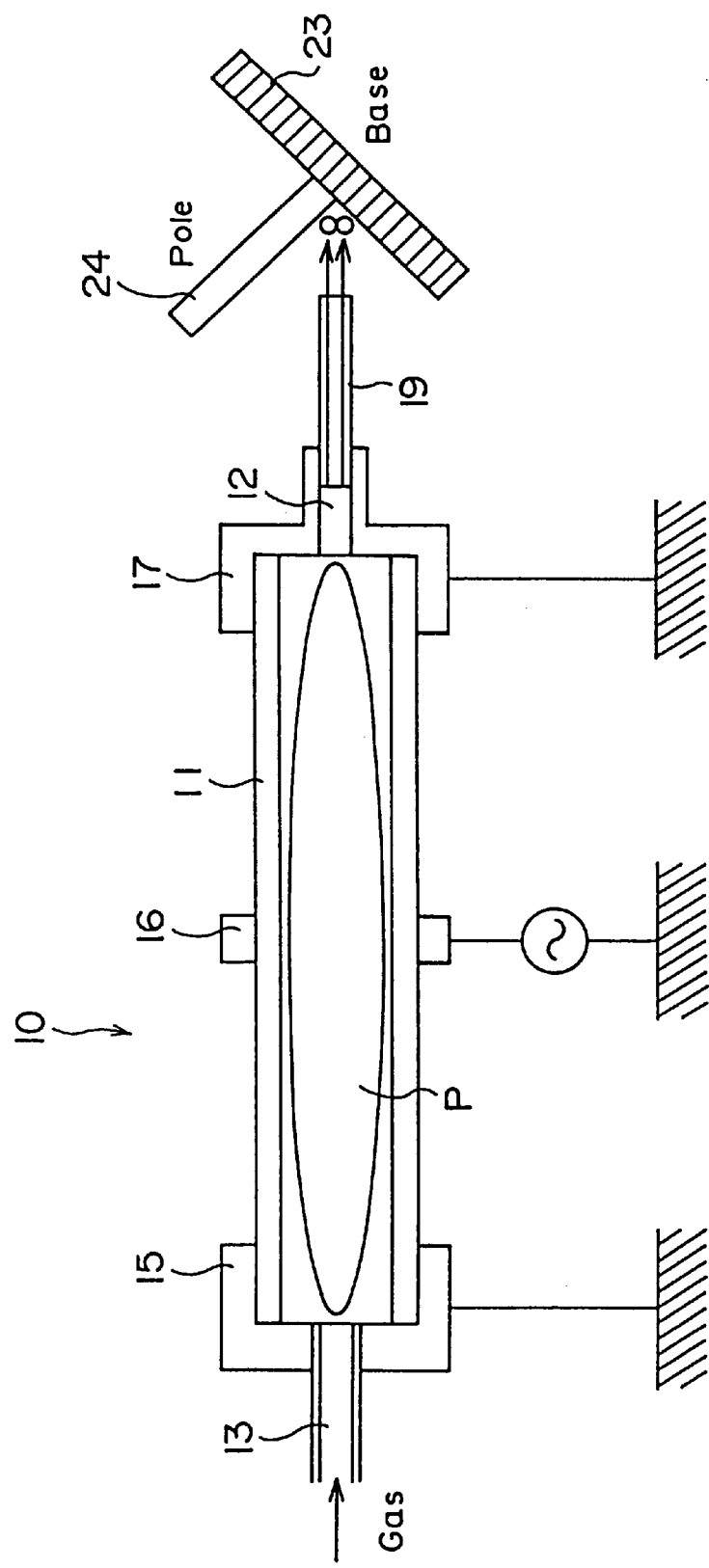
FIG. 30 is a schematic illustration of a process of the present invention.
Figure 31:
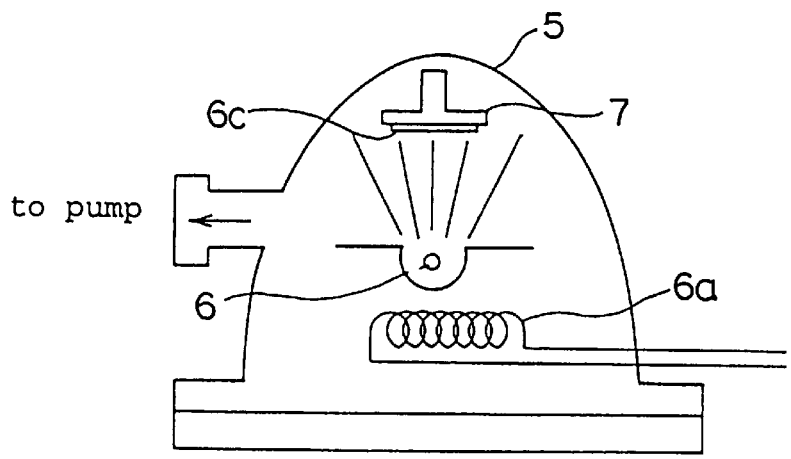
FIG. 31 is an illustration of a conventional method of making a film deposit.
Figure 32:
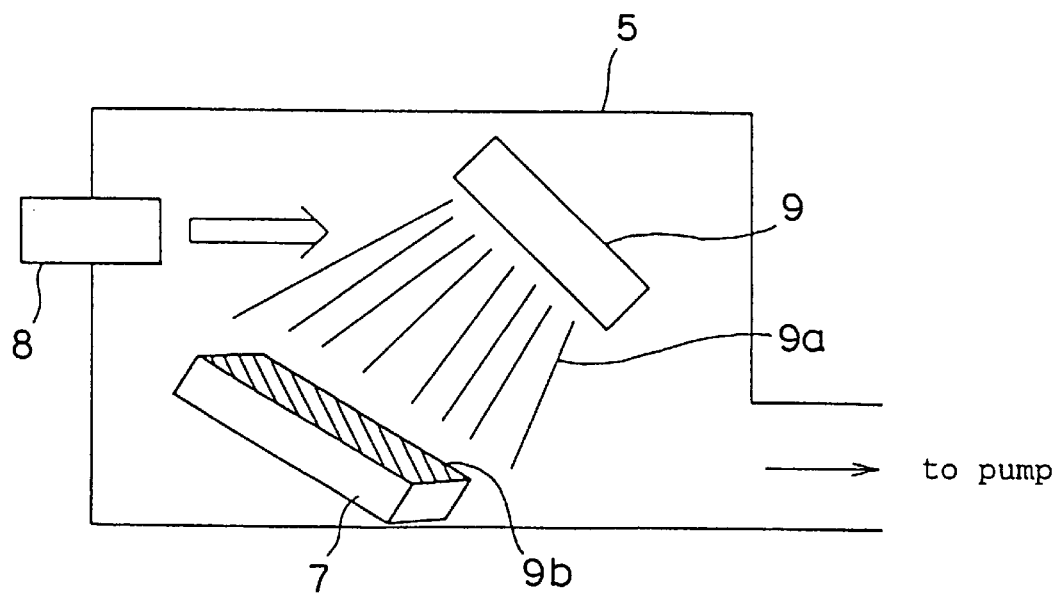
FIG. 32 is an illustration of a conventional method of making a film deposit.

FIG. 30 shows an embodiment in which different materials are joined with the use of a high frequency plasma beam.

A beam source 10 comprises a discharge (insulating) tube 11, an upstream electrode 15 and a downstream electrode 17 both of which are grounded, and a middle electrode 16 which is supplied with a high frequency voltage. It is permissible to apply a positive voltage to the upstream electrode 15. The middle electrode 16 may be a capacitively coupled type or an inductively coupled type. If capacitively coupled, a ring electrode is used, and if inductively coupled, a coil electrode is used. A plasma is generated by promotion of vibration of electrons by the application of high frequency voltage to the middle electrode 16. The positive ions in the plasma are accelerated by the biasing acceleration voltage towards the beam discharge opening 12 of downstream electrode 17, and are neutralized therein. By applying a positive voltage to the downstream electrode 17 and grounding the upstream electrode, it is possible to generate a highspeed atomic beam produced by the negative ions in the plasma.

In this embodiment, the downstream electrode is provided at its tip with a radical particle discharge nozzle 19 for forming a local film deposit. The radical particle discharge nozzle 19 disposed at the tip has an inside diameter of 0.1–3 mm, and may be provided with a screen hole of 0.1 nm–0.10 μm for forming a fine stream of radical particles.

This embodiment illustrates inserting a micro-sized rod piece 24 into a workpiece 23 followed by forming a local film deposit to bond the rod piece 24 to the workpiece 23. In this example, the diameter of rod piece 24 ranges between 10 nm–100 μm. Typical processing stages are as follows. Insertion cavities are produced by the highspeed atomic beam generated in the beam source apparatus shown in FIG. 28A, the component pieces are assembled while observing the assembly under magnifying means using micro-handling means, and the beam source is positioned on the joint area for local film deposition. The beam source in this case may be obtained by changing the parameters of the same electrode, or may utilize another beam source. Finally, a radical beam source is used to deposit a local bonding agent on the joint area as illustrated in FIG. 30.

Aligning of the assembly pieces and positioning of the beam source with the workpiece are carried out under magnifying means such as a light microscope or SEM using a micro-handling device or a micro-handling stage, capable of providing the micro-movements suitable for the task, to which the beam source and/or the workpiece is mounted.

In this embodiment, the beam source was mounted on a rotation/translation stage to permit irradiation at any orientation angle. However, it is also permissible to fix the beam source and move the workpiece as in other embodiments presented.

The micro-beam source for micro-fabrication of a workpiece may be any of a reactive radical particle beam of a film-forming material or a low-energy highspeed atomic beam. For example, if the process gas for the beam source is methane, carbon (C) containing radicals are formed, and the bonding agent 87 formed includes graphite and diamond-like carbon.

Other process gases include tungsten fluoride, aluminum chloride, titanium chloride and the like gases containing metallic components or carbon or hydrocarbon group gases containing C or C—H. The bonding agent formed at the joint area includes films of tungsten, aluminum, titanium, graphite, diamond-like carbon and polymeric films containing hydrocarbons. This type of forming a film deposit of a bonding agent for bonding two different materials is carried out mostly in a vacuum environment.

Reviewing the method of micro-fabricating a three-dimensional object presented above, the following salient feature are noted:

(1) Two different materials may be bonded or attached in a vacuum equally as well as bonding two objects made of a same material;

(2) Heating is local and there is no need to heat the entire workpiece;

(3) A plurality of micro-components can be bonded or attached in a vacuum;

(4) Fabrication may be carried out even on a complexly shaped workpiece.

For example, conventional methods of bonding require that the entire workpiece be heated to a temperature over 100 degrees in an evacuated environment, thus excluding the application of the method to polymeric materials. For semiconductor devices, such elevated temperature heating would lead to loss of device performance. However, the micro-fabrication method of the present invention presented above enables production of a three-dimensional structure of any material without encountering such problems.

Although not mentioned specifically, it is preferable that all the fabrication methods presented in FIGS. 21 to 30 be carried out in a vacuum environment, and micro-fabrication tasks under a magnifying means. In these embodiments, the beam source, mask and the workpiece were translated along or rotated about the orthogonally intersecting axes. However, it is clear that they may be moved along axes which may be intersecting at oblique angles.

Although the present invention has been described and illustrated with regard to embodiments having specific components and configurations, these examples are meant to be illustrative, not restrictive. It is clear that the present invention need not be limited to the specific configurations or procedures presented in these specific examples, and other suitable configurations of beam source may be utilized within the principle of an alterable in-situ beam source and a flexible irradiation configuration to permit a three-dimensional pattern to be fabricated on any surface and any location of a workpiece, which heretofore has not been possible.

What is claimed is:

1. A method of performing a predetermined micro-fabrication operation including at least one of material removal and deposition on a three-dimensional workpiece, said method comprising:

providing a beam source having at least three electrodes on a manipulator enabling translational movement of said beam source in directions along at least two intersecting axes and rotational movement of said beam source around at least two axes, thereby enabling a discharge of said beam source to be directed at any orientation angle;

positioning said workpiece on a support enabling translational movement of said workpiece in directions along at least two intersecting axes and rotational movement of said workpiece around at least two axes;

operating said manipulator and said support to move said beam source and said workpiece relative to said axes to position said discharge of said beam source to be directed toward only a selected local surface area of said workpiece;

generating in said beam source a low-energy beam suitable for performing said predetermined micro-fabrication operation, said generating including controlling the energy level and particle type of said beam by selectively connecting to each said electrode a voltage selected from the group consisting of a high frequency voltage, a direct current voltage and ground voltage;

discharging said beam from said discharge of said beam source and irradiating said beam directly from said beam source onto only said selected local surface area of said workpiece; and said micro-fabrication operation comprising removing material at said selected local surface area to form a recess thereat, and further comprising positioning a second workpiece in said recess, and then irradiating a low-energy beam onto a juncture between said workpiece and said second workpiece to perform a further micro-fabrication operation of bonding said second workpiece in said recess to said workpiece.

2. A method as claimed in claim 1, further comprising, during said discharging, operating at least one of said manipulator and said support to move at least one of said beam source and said workpiece relative to said axes, and thereby conducting said predetermined micro-fabrication operation along a further local area only of said workpiece.

3. A method as claimed in claim 2, wherein said local surface area and said further local surface area are at least partially located on a common surface of said workpiece.

4. A method as claimed in claim 2, wherein said local surface area and said further local surface area are at least partially located on different surfaces of said workpiece.

5. A method as claimed in claim 1, wherein said beam is a converging beam having a diameter of 0.1 nm to 100 $\mu$m.

6. A method as claimed in claim 1, wherein said beam is a non-convergent beam having a diameter of 1 $\mu$m to 300 mm.

7. A method as claimed in claim 1, further comprising passing said beam through a mask positioned between said beam source and said workpiece.

8. A method as claimed in claim 1, wherein said beam has a species of particles selected from the group consisting of positive ions, negative ions, high speed neutral atoms, radical particles and electrons.

9. A method as claimed in claim 1, further comprising observing by a light microscope or a scanning electron microscope said selected local surface area of said workpiece while said selected local surface area is being irradiated with said beam.

10. A method as claimed in claim 1, comprising performing said removing and said bonding by respective beams generated in the same said beam source.

11. A method as claimed in claim 1, comprising performing said removing and said bonding by respective beams generated in separate respective beam sources.

12. A method as claimed in claim 1, wherein said workpiece and said second workpiece are formed of different materials.

13. A method as claimed in claim 1, wherein said manipulator enables translational movement of said beam source in directions along three intersecting axes and rotational movement of said beam source about said three intersecting axes.

14. A method as claimed in claim 1, wherein said operating comprises rotating said beam source about at least one said axis.

15. A method as claimed in claim 1, wherein said operating comprises rotating said workpiece about at least one said axis.

* * * * *